(12) United States Patent
Chung et al.

(10) Patent No.: US 12,087,715 B2
(45) Date of Patent: *Sep. 10, 2024

(54) INTEGRATED CIRCUIT FEATURES WITH OBTUSE ANGLES AND METHOD OF FORMING SAME

(71) Applicant: Taiwan Semiconductor Manufacturing Co., Ltd., Hsinchu (TW)

(72) Inventors: Shu-Wei Chung, Taichung (TW); Yen-Sen Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/053,220

(22) Filed: Nov. 7, 2022

(65) Prior Publication Data

US 2023/0116270 A1 Apr. 13, 2023

Related U.S. Application Data

(60) Continuation of application No. 17/101,567, filed on Nov. 23, 2020, now Pat. No. 11,495,558, which is a
(Continued)

(51) Int. Cl.
*H01L 23/00* (2006.01)
*G06F 30/394* (2020.01)
*H01L 21/768* (2006.01)

(52) U.S. Cl.
CPC ............ *H01L 24/03* (2013.01); *G06F 30/394* (2020.01); *H01L 21/76865* (2013.01);
(Continued)

(58) Field of Classification Search
None
See application file for complete search history.

(56) References Cited

U.S. PATENT DOCUMENTS 7,626,276 B2 12/2009 Hess et al.
9,391,035 B2 7/2016 Tomita et al.
(Continued)

FOREIGN PATENT DOCUMENTS

CN 104253053 A 12/2014
CN 104979317 A 10/2015
(Continued)

*Primary Examiner* — Asok K Sarkar
(74) *Attorney, Agent, or Firm* — Slater Matsil, LLP

(57) ABSTRACT

A method includes forming a seed layer on a semiconductor wafer, coating a photo resist on the seed layer, performing a photo lithography process to expose the photo resist, and developing the photo resist to form an opening in the photo resist. The seed layer is exposed, and the opening includes a first opening of a metal pad and a second opening of a metal line connected to the first opening. At a joining point of the first opening and the second opening, a third opening of a metal patch is formed, so that all angles of the opening and adjacent to the first opening are greater than 90 degrees. The method further includes plating the metal pad, the metal line, and the metal patch in the opening in the photo resist, removing the photo resist, and etching the seed layer to leave the metal pad, the metal line and the metal patch.

20 Claims, 29 Drawing Sheets

Related U.S. Application Data division of application No. 16/297,938, filed on Mar. 11, 2019, now Pat. No. 10,861,807.

(60) Provisional application No. 62/770,445, filed on Nov. 21, 2018.

(52) U.S. Cl.
CPC ............... *H01L 2224/02313* (2013.01); *H01L 2224/0235* (2013.01); *H01L 2224/03001* (2013.01); *H01L 2224/0347* (2013.01); *H01L 2924/3512* (2013.01)

(56) References Cited

U.S. PATENT DOCUMENTS

| | | | |
|---|---|---|---|
| 9,559,044 | B2 | 1/2017 | Yang et al. |
| 11,495,558 | B2 * | 11/2022 | Chung .............. H01L 21/76865 |
| 2002/0149086 | A1 | 10/2002 | Aoki |
| 2010/0181666 | A1 | 7/2010 | Andou |
| 2014/0252611 | A1 | 9/2014 | Chen et al. |
| 2015/0054167 | A1 | 2/2015 | Pendse |
| 2015/0155249 | A1 | 6/2015 | Hu et al. |
| 2018/0226370 | A1 | 8/2018 | Yang et al. |
| 2019/0096798 | A1 | 3/2019 | Aleksov et al. |

FOREIGN PATENT DOCUMENTS

| | | |
|---|---|---|
| CN | 106304667 A | 1/2017 |
| JP | 2008192961 A | 8/2008 |
| KR | 20070099599 A | 10/2007 |

\* cited by examiner

INTEGRATED CIRCUIT FEATURES WITH OBTUSE ANGLES AND METHOD OF FORMING SAME

PRIORITY CLAIM AND CROSS-REFERENCE

This application is a continuation of U.S. patent application Ser. No. 17/101,567, entitled "Integrated Circuit Features with Obtuse Angles and Method of Forming Same," and filed Nov. 23, 2020, which is a divisional of the U.S. patent application Ser. No. 16/297,938, entitled "Integrated Circuit Features with Obtuse Angles and Method of Forming Same," and filed Mar. 11, 2019, now U.S. Pat. No. 10,861,807 issued May 21, 2020, which claims the priority of the U.S. Provisional Application No. 62/770,445, filed Nov. 21, 2018, and entitled "Metal Pads and Metal Lines and Method Forming Same," which applications are hereby incorporated herein by reference.

BACKGROUND

Integrated circuits include various types of features for interconnection purpose. For example, metal pads are commonly used for upper-level features such as contact plugs, vias, etc. landing thereon. The Metal pads may be connected to metal lines, which are much narrower than the metal pads. The metal lines may be used for electrically routing electrical signals, voltages, currents, and so on to and from the metal pads. Due to the large size of the metal pads and the small widths of the metal lines, reliability issues may arise. For example, there may be cracks occurring at the interface between the metal lines and the metal pads. Also, the dielectric layers adjacent to the metal pads may also crack due to the stress applied by the metal pads.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
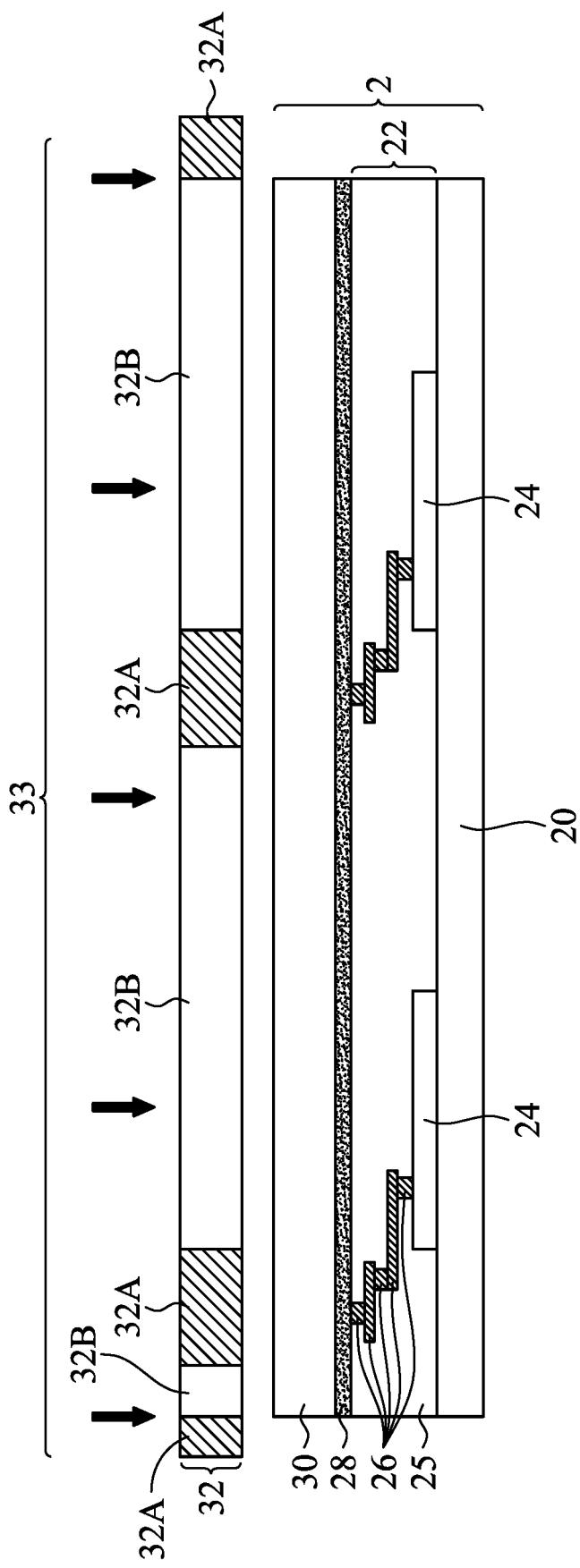
FIGS. 1 through 11 illustrate the cross-sectional views and top views of intermediate stages in the formation of package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit structure including a pad and the corresponding connecting lines and the method of forming the same are provided in accordance with various embodiments. The intermediate stages in the formation of the pad and the connecting lines are illustrated in accordance with some embodiments. Some variations of some embodiments are discussed. Throughout the various views and illustrative embodiments, like reference numbers are used to designate like elements.

In accordance with some embodiments of the present disclosure, a technical solution is provided to solve a technical problem. The technical problem is related to an integrated circuit structure including a pad and lines connected to the pad, which, when right angles or acute angles are formed between the edges of the pad and the lines, due to the thermal expansion and contraction of the metal pad and the lines, stress is concentrated on the joining regions of the pad and the lines, causing cracks at the joining regions. The concentrated stress may also be imparted to adjacent dielectric layers, causing the cracks of the dielectric layers.

The technical solution to such technical problem includes, in the design stage of the integrated circuit structure, modifying the pattern of the integrated circuit structure by adding patches. The modified pattern is then used to form lithography masks, which are used to manufacture the integrated circuit structure on a wafer. In order to determine where to add patches, Boolean operations are performed on the patterns of the pad and the lines to determine boundary regions of the pad and the lines, so that patches can be added into the boundary regions. The patches form obtuse angles with the pad and the lines. Through this operation, all acute angles and right angles that otherwise would be formed between the pad and lines are eliminated.

Figure 40:
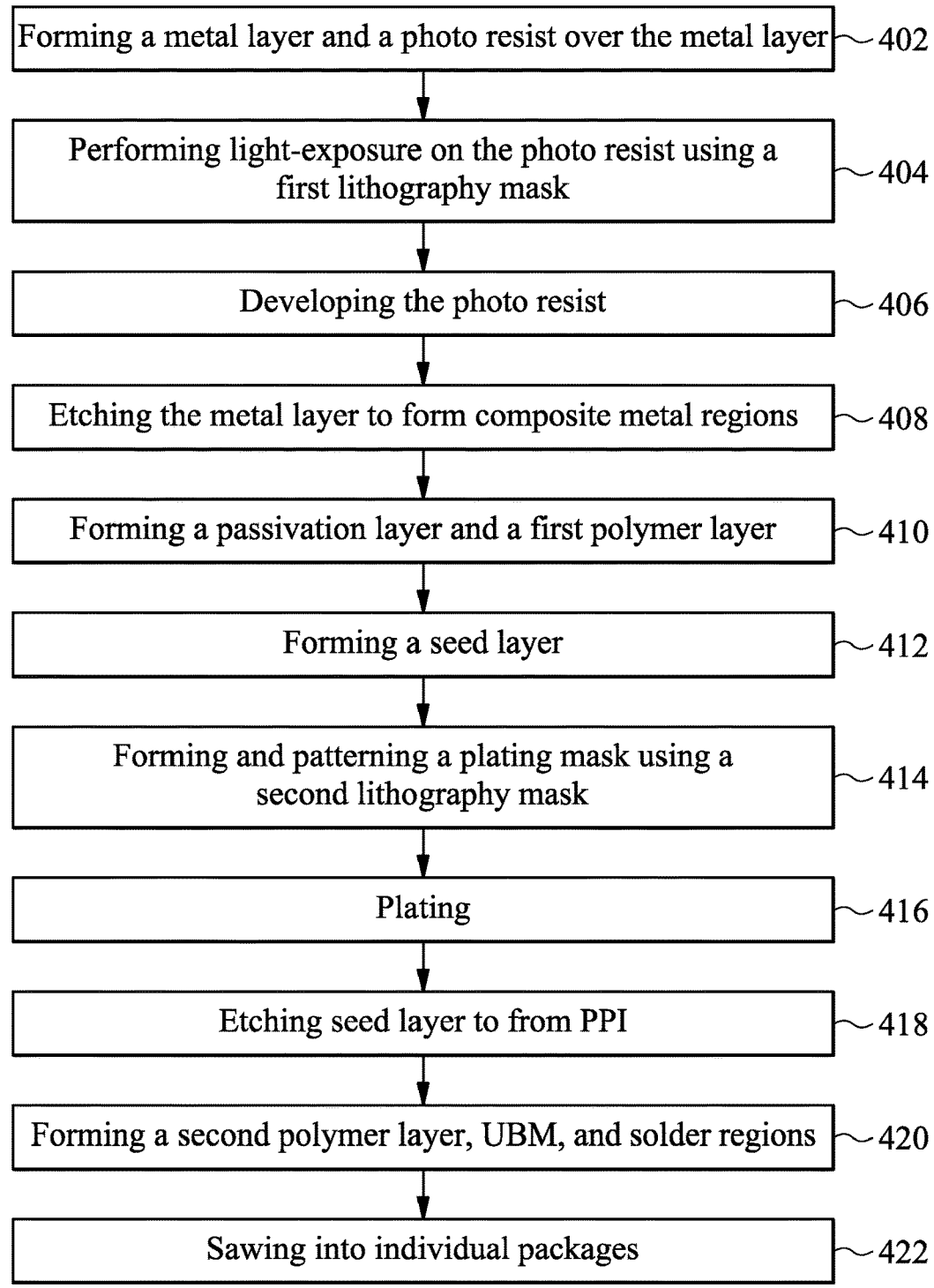
FIG. 40 illustrates a process flow for forming a device die in accordance with some embodiments.

FIGS. 1 through 11 illustrate the cross-sectional views of intermediate stages in the formation of a wafer and device dies including metal pads and connecting metal lines in accordance with some embodiments of the present disclosure. The corresponding processes are also reflected schematically in the process flow 400 shown in FIG. 40. It is appreciated that FIGS. 1 through 11 illustrate some examples for forming pads and connecting lines, in which examples, the pads and metal lines are formed at the metal pad level (sometimes referred to as aluminum pad level) and/or Post-Passivation Interconnection (PPI) level. It is appreciated that the embodiments of the present disclosure may be applied to any level of integrated circuits including, and not limited to, transistors (such as metal gate routing), alignment marks, seal ring structures, bumps, routing lines, metal lines in low-k dielectric layers, and the like.

Referring to FIG. 1, wafer 2 is provided. Wafer 2 includes substrate 20, which may be a semiconductor substrate such as a silicon substrate, while it may also be formed of other semiconductor materials including, and not limited to, silicon germanium, silicon carbon, gallium arsenide, or the like. In accordance with some embodiments of the present disclosure, wafer 2 is a device wafer, and semiconductor devices 24 (such as transistors, resistors, capacitors, inductors, and/or the like) are formed at the surface of substrate 20. Interconnect structure 22, which includes metal lines and vias 26 formed therein, is formed over substrate 20. Metal lines and vias 26 are electrically coupled to semiconductor devices 24. Metal lines and vias 26 may be formed of copper or copper alloys, and may be formed using damascene processes. Interconnect structure 22 may include a plurality of dielectric layers 25, which may include an Inter-Layer Dielectric (ILD, not shown) and Inter-Metal Dielectrics (IMDs, not shown), with metal lines and vias 26 disposed in dielectric layers 25. In accordance with alternative embodiments, wafer 2 is an interposer wafer or a package substrate, and is substantially free from integrated circuit devices.

Metal layer 28 is formed over interconnect structure 22 as a blanket layer. Metal layer 28 may be formed, for example, through Physical Vapor Deposition (PVD), Chemical Vapor Deposition, or the like. The respective process is illustrated as process 402 in the process flow shown in FIG. 40. Metal layer 28 may comprise aluminum (Al), copper (Cu), silver (Ag), gold (Au), nickel (Ni), tungsten (W), alloys thereof, and/or multi-layers thereof. Metal layer 28 may be electrically coupled to semiconductor devices 24, for example, through metal lines and vias 26. Photo resist 30 is coated on metal layer 28. The respective process is also illustrated as process 402 in the process flow shown in FIG. 40.

Lithography mask 32 is placed over photo resist 30. Lithography mask 32 includes transparent portions 32B allowing light to pass through, and opaque portions 32A for blocking light from passing through. Light beam 33 is projected on lithography mask 32, so that some portions of photo resist 30 directly underlying transparent portions 32B are exposed, and some other portions of photo resist 30 directly underlying opaque portions 32A are not exposed. The respective process is illustrated as process 404 in the process flow shown in FIG. 40.

Figure 2:
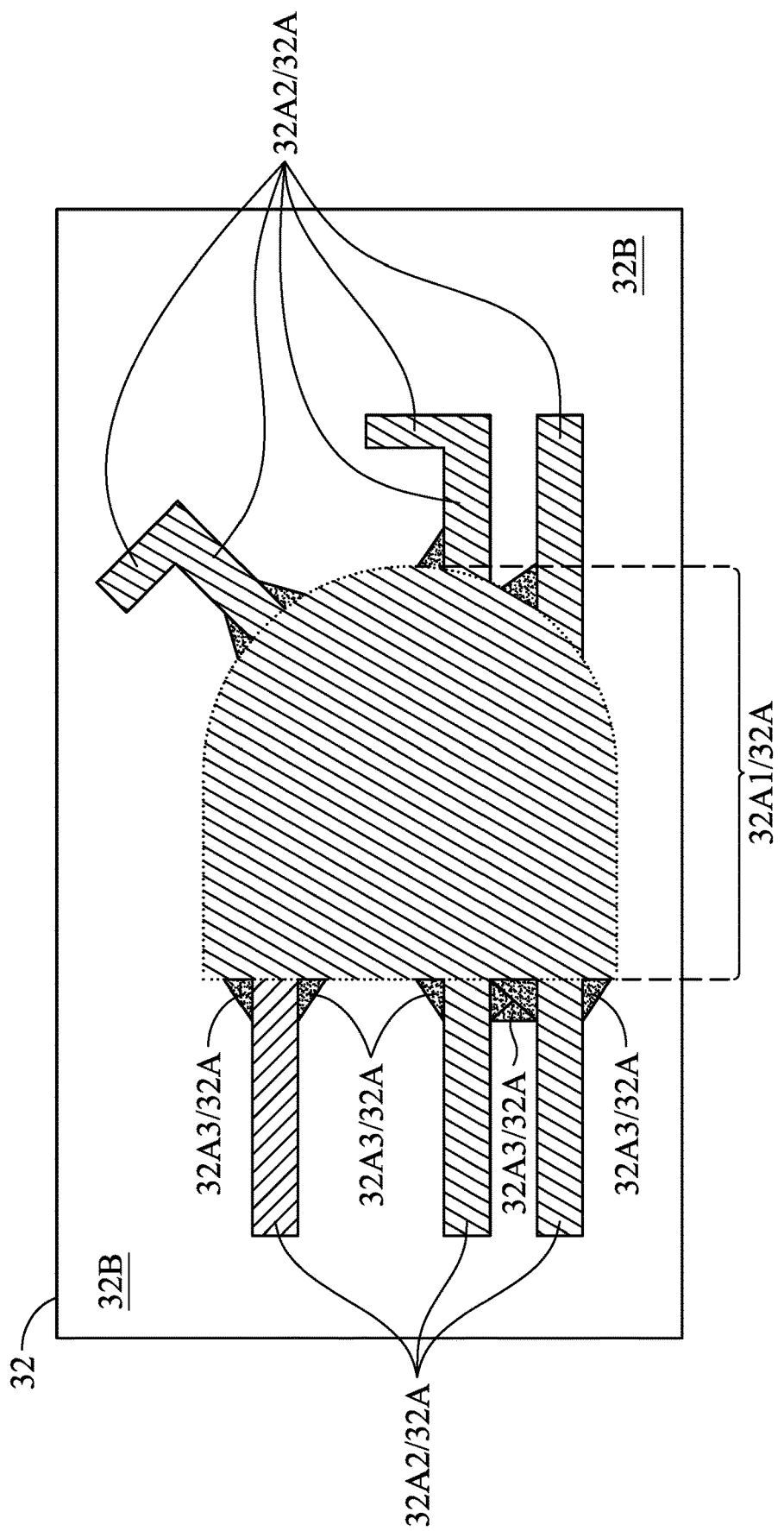

FIG. 2 illustrates a top view of a portion of lithography mask 32 in accordance with some embodiments of the present disclosure. The patterns of lithography mask 32 including opaque portions 32A and transparent portions 32B, which are schematically illustrated in accordance with some embodiments. It is appreciated that although the opaque portions are illustrated as including the patterns of a pad and lines, the patterns may be inversed, and transparent portions may include the patterns of the pad and the lines, depending on whether photo resist 30 (FIG. 1) is a positive photo resist or a negative photo resist. The patterns include pad portion 32A1, line portions 32A2, and patch portions 32A3. Although the interfaces between portions 32A1, 32A2, and 32A3 are shown, portions 32A1, 32A2, and 32A3 actually form a continuous pattern with no distinguishable interfaces therebetween.

Figure 3:
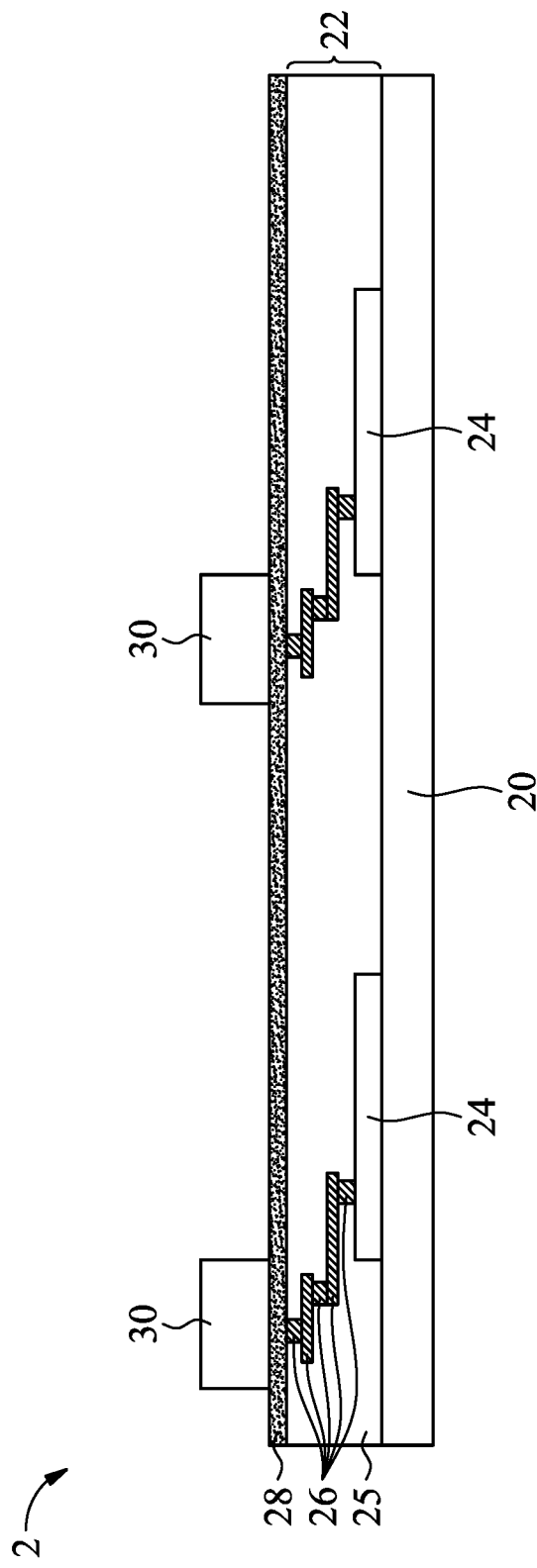
Figure 4:
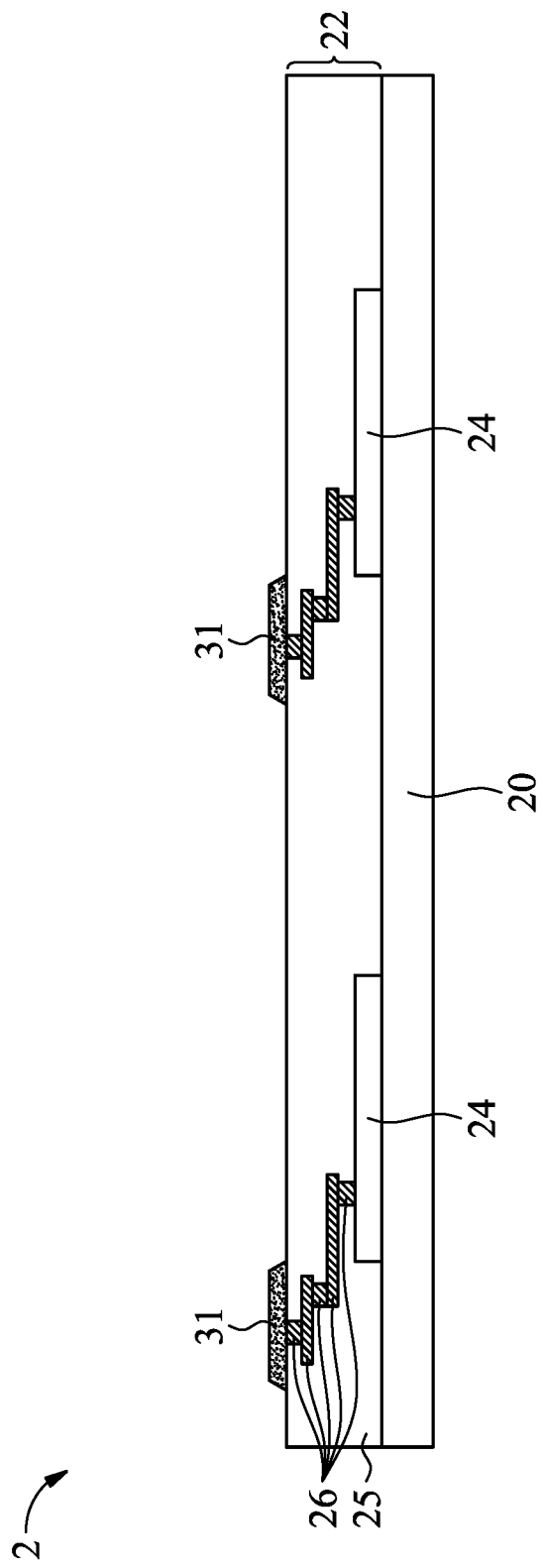
Figure 12:
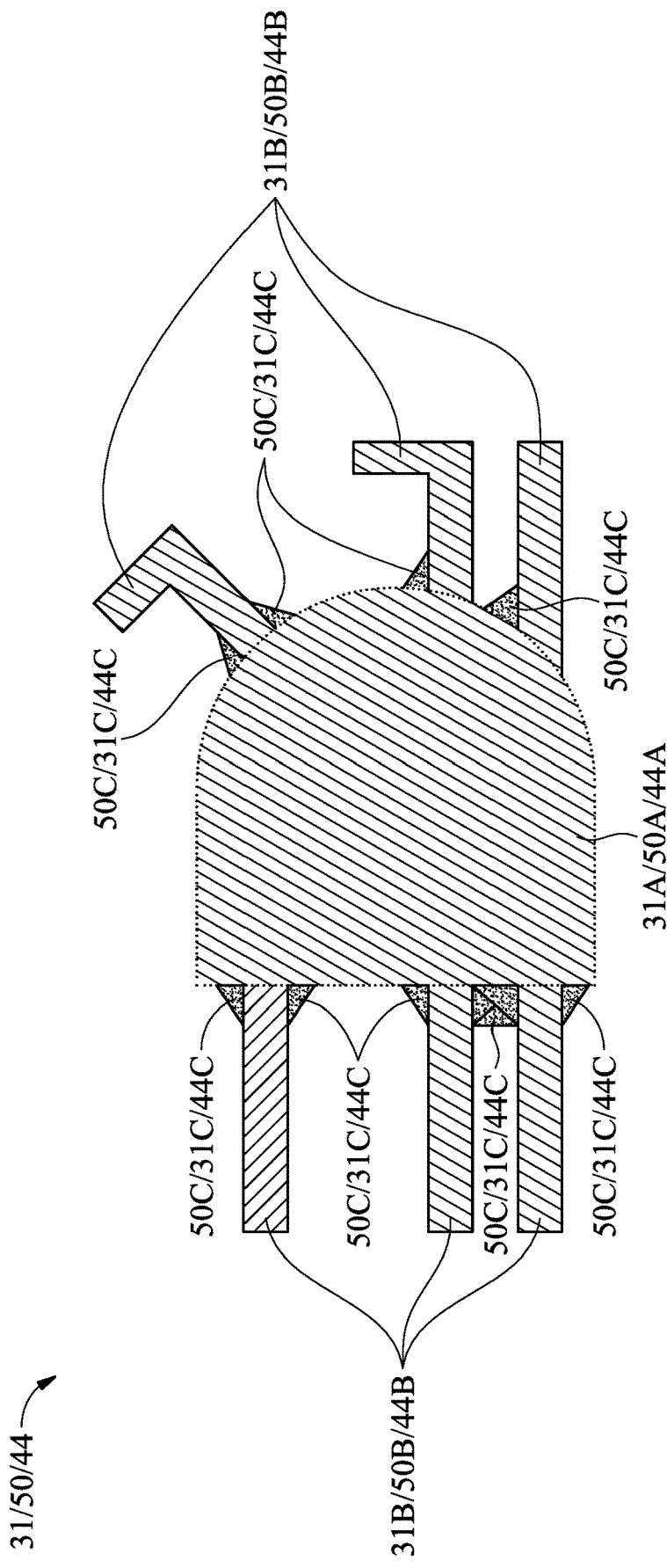
FIG. 12 illustrates a top view of a metal pad and metal lines in accordance with some embodiments.

Next, referring to FIG. 3, the exposed photo resist 30 is developed to remove some portions, and the remaining portions may have the patterns as shown in FIG. 2. The respective process is illustrated as process 406 in the process flow shown in FIG. 40. In a subsequent process, as shown in FIG. 4, the patterned photo resist 30 is used as an etching mask to etch metal layer 28, so that composite metal regions 31 are formed. The respective process is illustrated as process 408 in the process flow shown in FIG. 40. A top view of the composite metal regions 31 is shown in FIG. 12. Composite metal region 31 includes metal pad 31A and metal lines 31B connected to metal pad 31A in accordance with some embodiments. Composite metal region 31 also includes metal patches 31C. Although the interfaces between metal pad 31A, metal lines 31B, and metal patches 31C are shown with dashed lines for identification purpose, these features actually form a continuous region with no distinguishable interfaces therebetween.

Figure 5:
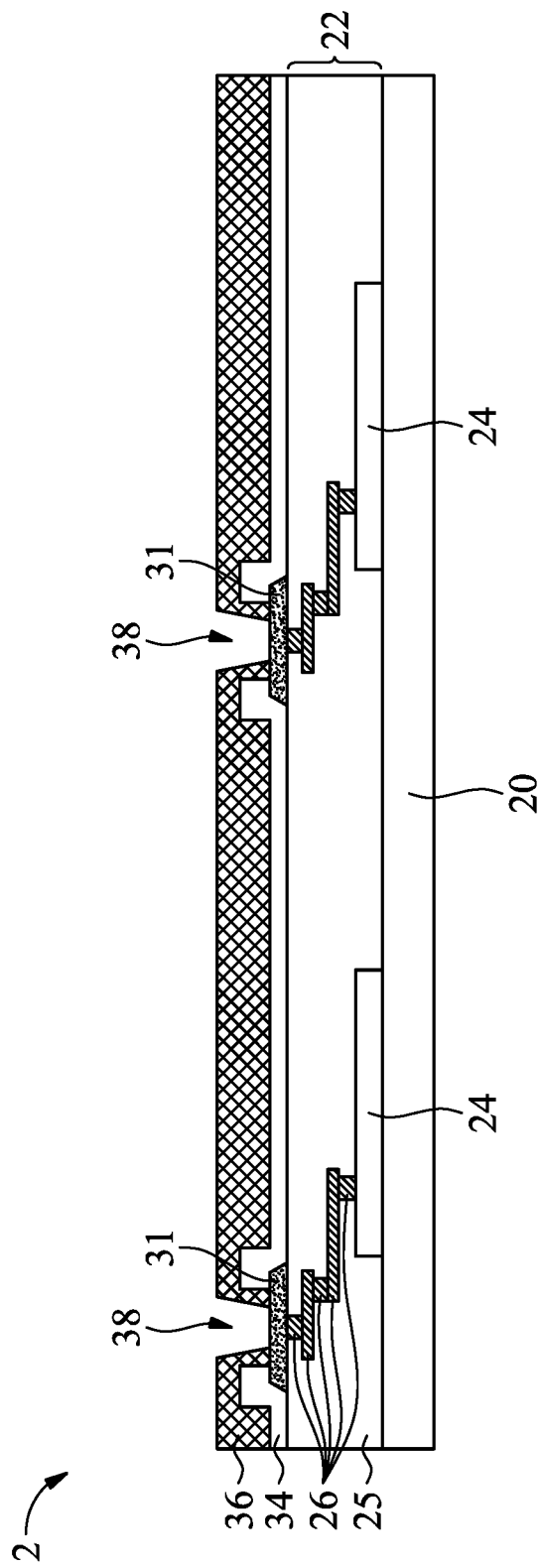

Referring to FIG. 5, passivation layer 34 is formed to cover the edge portions of metal pad 31A in composite metal region 31. The respective process is illustrated as process 410 in the process flow shown in FIG. 40. In accordance with some embodiments of the present disclosure, passivation layer 34 comprises a silicon oxide layer and a silicon nitride layer over the silicon oxide layer, although other dielectric materials such as Un-doped Silicate Glass (USG) may be used. Openings 38 are formed in passivation layer 34, and hence the central portions of the metal pads in composite metal regions 31 are exposed through openings 38.

Polymer layer 36 is formed over passivation layer 34, wherein polymer layer 36 extends into openings 38 in passivation layer 34. The respective process is also illustrated as process 410 in the process flow shown in FIG. 40. Polymer layer 36 may include a photo sensitive material in accordance with some embodiments. For example, the material of polymer layer 36 includes, and is not limited to, polyimide, polybenzoxazole (PBO), or the like. Polymer layer 36 is also patterned to recover some portions of openings 38, so that the metal pads in composite metal regions 31 are exposed.

Figure 6:
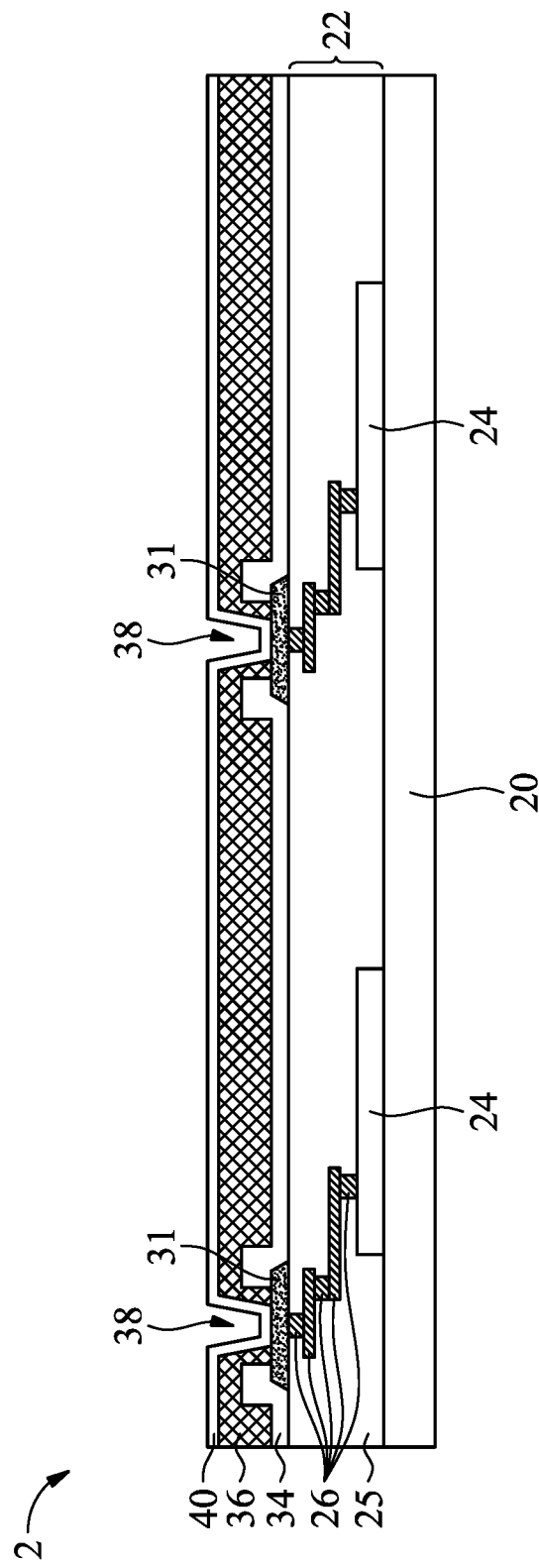

Next, as shown in FIG. 6, seed layer 40 is formed over polymer layer 36. The respective process is illustrated as process 412 in the process flow shown in FIG. 40. In accordance with some embodiments of the present disclosure, seed layer 40 is a composite layer comprising a plurality of layers. For example, seed layer 40 may include a bottom layer and an upper layer (not shown), wherein the bottom layer includes a titanium layer, a titanium nitride layer, a tantalum layer, a tantalum nitride layer, or the like. The materials of the upper layer may include copper or a copper alloy. In accordance with alternative embodiments, seed layer 40 may be a single layer, which may be a copper layer, for example. Seed layer 40 may be formed using PVD, while other applicable methods may also be used.

Figure 7:
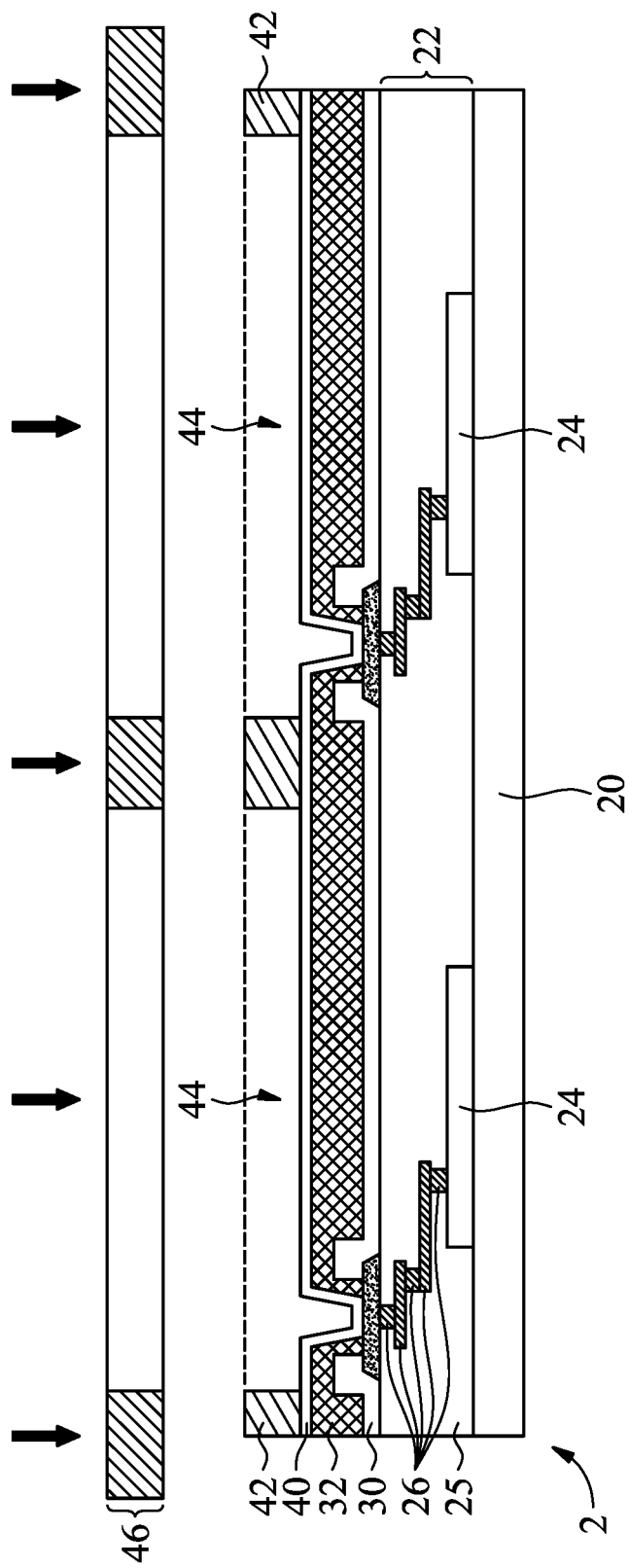
Figure 8:
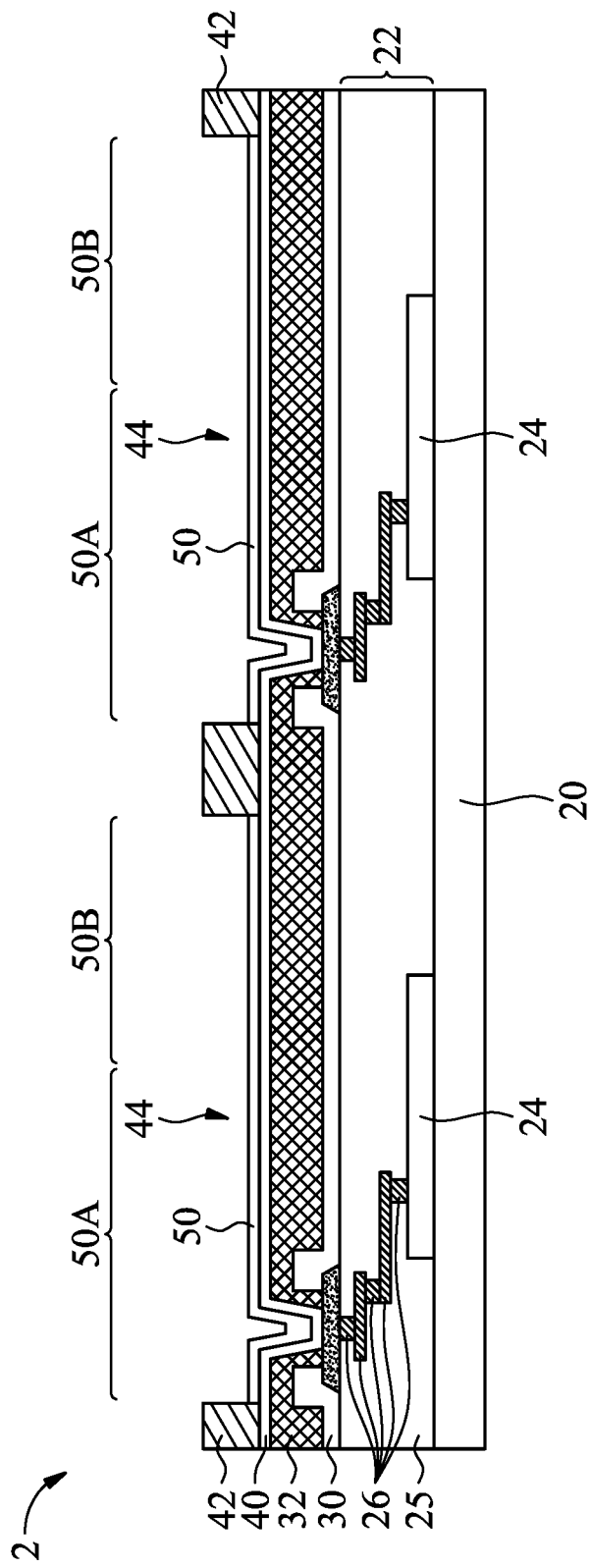

FIG. 7 illustrates the formation of patterned plating mask 42. The respective process is illustrated as process 414 in the process flow shown in FIG. 40. In accordance with some embodiments of the present disclosure, plating mask 42 is formed of a photo resist, and hence is alternatively referred to as plating mask 42 throughout the description, although other materials may be used. Plating mask 42 is patterned to form openings 44, through which some portions of seed layer 40 are exposed. The formation of the patterned plating mask 42 may include forming a blanket photo resist layer, exposing the blanket photo resist layer using lithography mask 46, and developing the blanket photo resist layer. Lithography mask 46 may also include opaque portions and transparent portions. An example pattern of a portion of lithography mask 46 may also be similar to what is shown in FIG. 2. The patterns in lithography mask 46 may include pad portions, line portions, and patch portions, similar to what are shown in FIG. 2. The details are thus not discussed herein. Accordingly, an opening 44 also include pad portion 44A, line portion 44B, and patch portion 44C, which are also in FIG. 12.

Figure 9:
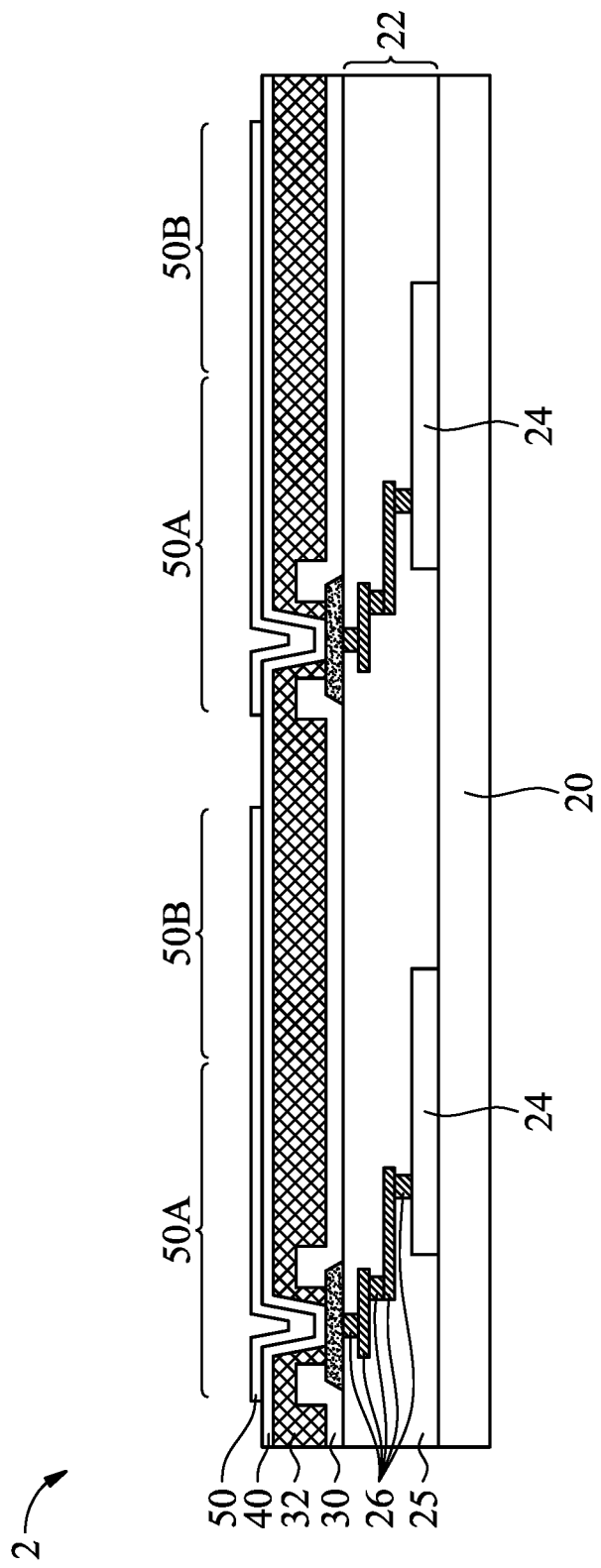
Figure 10:
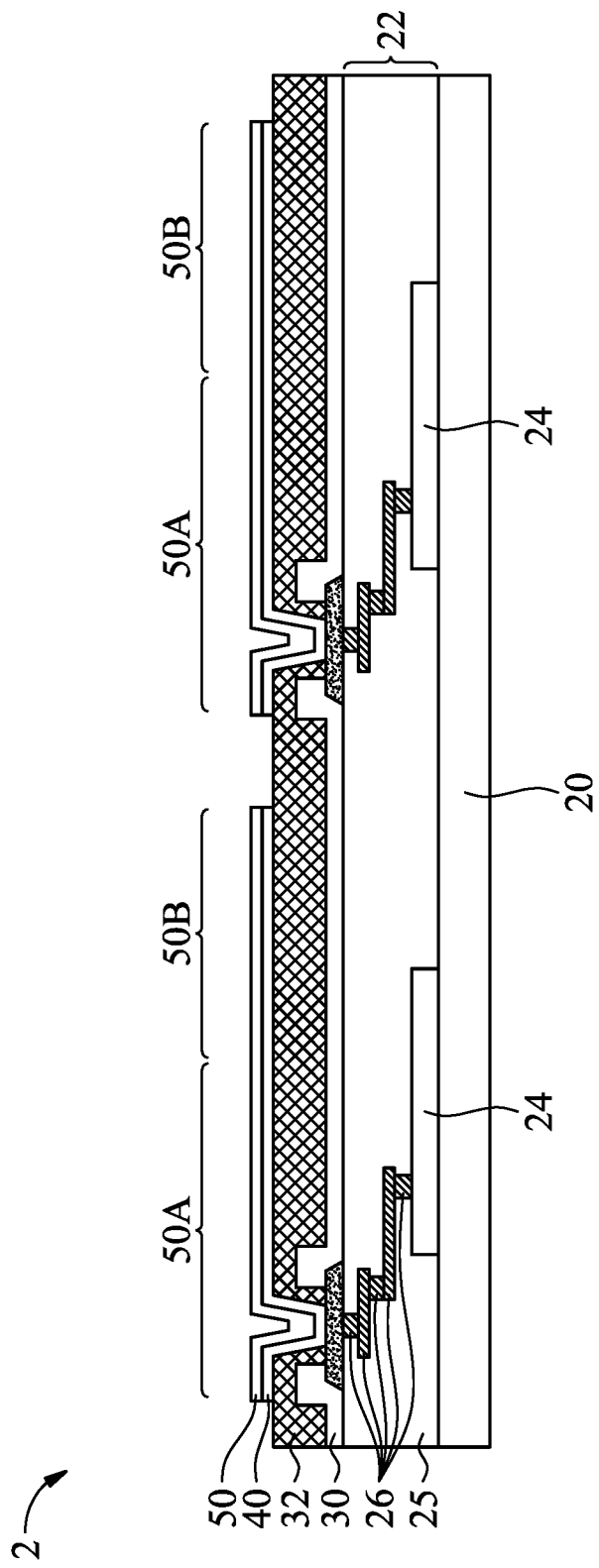

Next, a plating process is performed to form Post-Passivation Interconnects (PPIs) 50 in openings 44, as shown in FIG. 7. The respective process is illustrated as process 416 in the process flow shown in FIG. 40. PPIs 50 may include a copper-containing layer including copper or a copper alloy. In accordance with alternative embodiments, PPIs 50 comprise a nickel-containing layer, a palladium-containing layer, and/or the like, in additional to the copper-containing layer.

plating mask 42 is then removed, for example, in a photo resist stripping process, and the resulting structure is shown in FIG. 9. Next, as shown in FIG. 10, the exposed portions of seed layer 40 that were previously covered by plating mask 42 are removed through etching, while the portions of seed layer 40 covered by PPIs 50 remain un-removed. Throughout the description, the subsequently referred PPIs 50 also include the remaining portions of seed layer 40.

PPI 50 may include PPI pad 50A, PPI lines 50B connected to PPI pad 50A, and PPI patches 50C. The top-view shapes PPI 50 may be represented by composite feature 50 in FIG. 12. Although the interfaces between PPI pad 50A, PPI lines 50B connected to PPI pad 50A, and PPI patches 50C are shown with dashed lines for identification purpose, these features actually form a continuous region with no distinguishable interfaces therebetween. It is appreciated that although both composite metal region 31 and PPI 50 are shown using the same FIG. 12, FIG. 12 is merely used to show that both composite metal region 31 and PPI 50 may include pads, lines, and patches. The patterns of composite metal region 31, however, may be different from the patterns of PPI 50.

Figure 11:
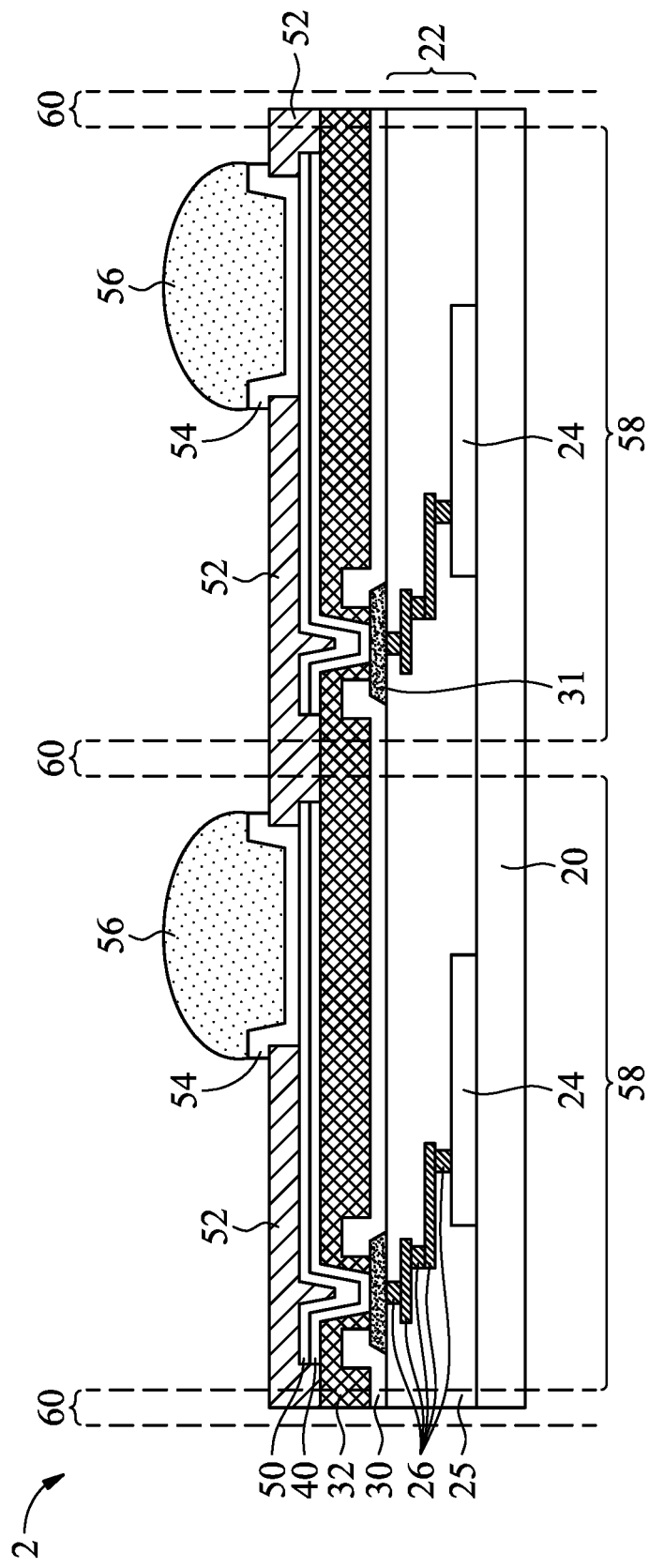

FIG. 11 illustrates the formation of polymer layer 52, Under-Bump-Metallurgy (UBMs) 54, and electrical connectors (such as solder regions) 56. The respective process is illustrated as process 420 in the process flow shown in FIG. 40. Next, wafer 2 is singulated in a die-saw process along scribe lines 60, so that device dies 58 are formed. The respective process is illustrated as process 422 in the process flow shown in FIG. 40.

As aforementioned, the formation of PPIs 50 and composite metal regions 31 may include lithography processes, in which lithography masks are used for the light-exposure of photo resists. The patterns that will be formed on lithography masks are processed through a plurality of processes, which include Boolean operations and patching processes, as discussed referring to FIGS. 13 through 27. Through the Boolean operations, an initial pattern of a composite feature including a pad and lines is processed to identify the boundary regions of the pad and lines. Patches are then added in a patching process(es) to the initial pattern to form a modified pattern, so that the acute angles and normal angles in the initial pattern are replaced with obtuse angles in the modified pattern. As a result, when the modified pattern is used to form photo lithography masks (such as photo lithography masks 32 and 46 in FIGS. 1 and 7, respectively), the resulting composite metal regions 31 and PPIs 50 do not have the right angles and acute angles formed between pads and lines.

Figure 13:
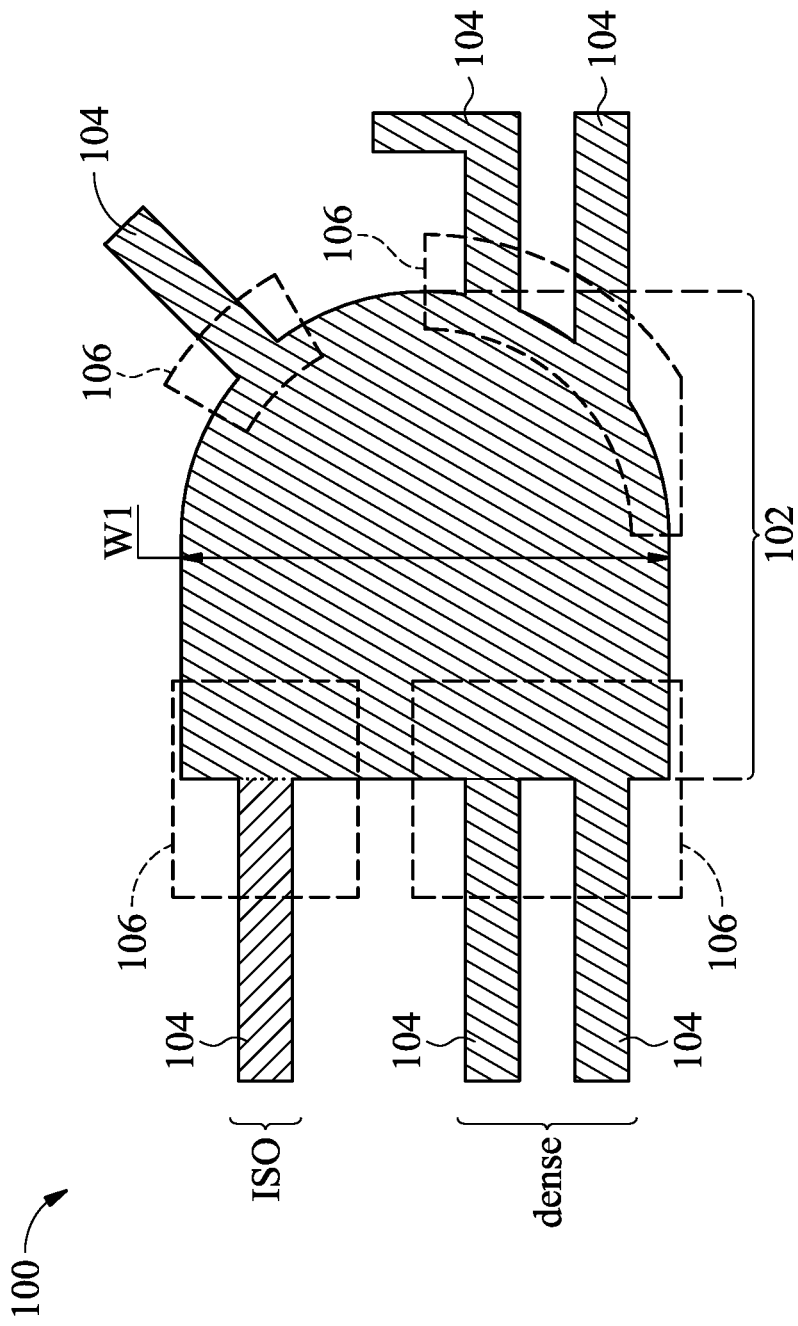
FIG. 13 illustrates an initial pattern of a pad and connecting lines in accordance with some embodiments.

FIG. 13 illustrates an initial composite pattern 100, which includes pad portion 102, and line portions 104 connected to pad portion 102. In accordance with some embodiments of the present disclosure, a feature (such as 102) is referred to as a "pad" when its width W1 is greater than a pre-defined value, such as about 31.5 μm, or when it has a smallest reasonable dimension to fit a probe pin, so that the "pad" may be used for probing electrical performance. A pad may also be defined according to the change in the width of features, and when a wider portion of the features is connected to a narrow portion, with a width ratio of the wider portion to a width of the connecting narrow portion being over about 9.0, the wider portion can be defined as a pad, and the narrower portion may be referred to as a line. Lines 104 may form iso (isolated) regions, in which the lines are relatively far away from each other, and may form dense regions in which the lines 104 are close to each other.

Figure 27:
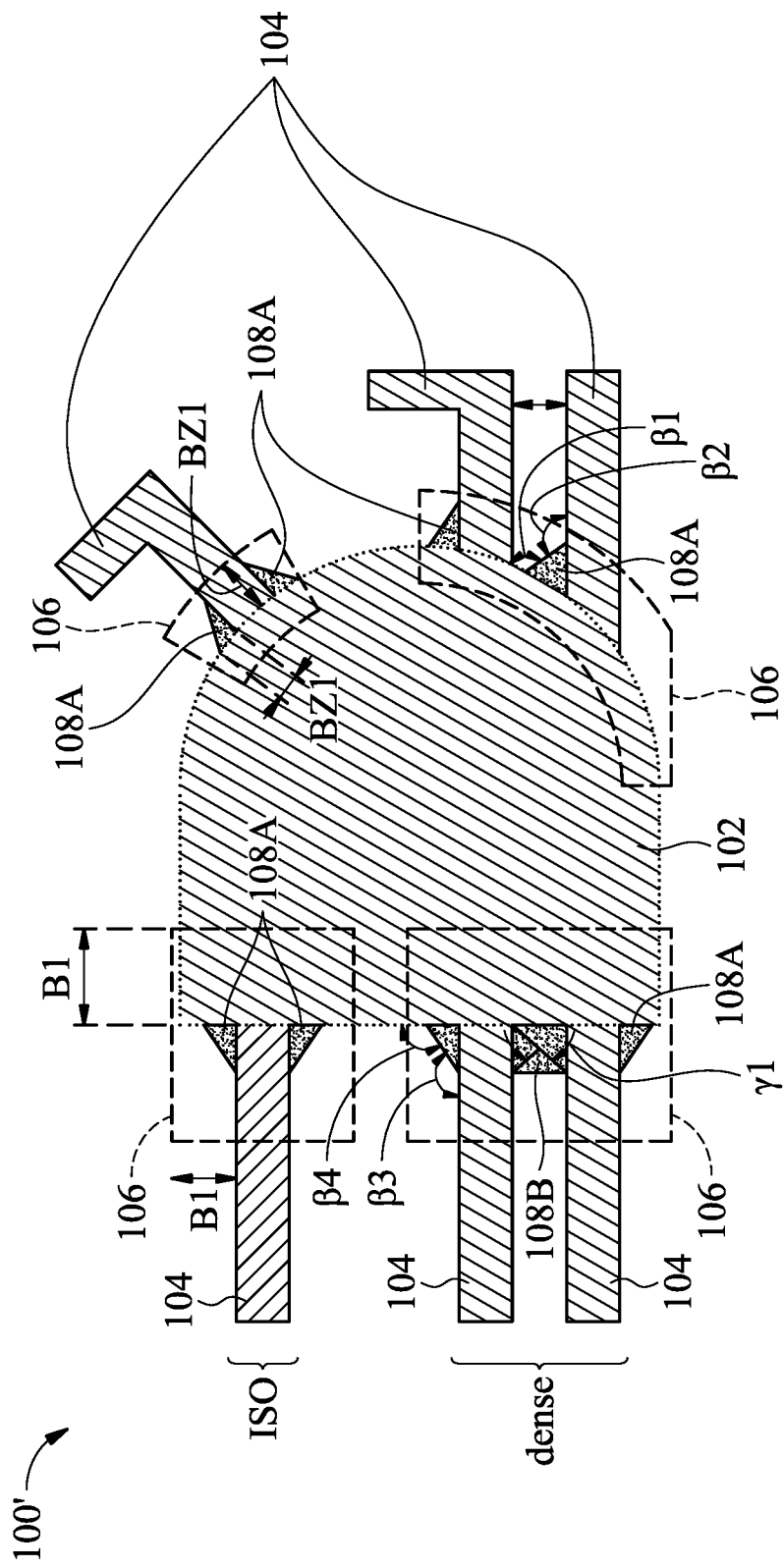
FIG. 27 illustrates the patterns of patches added to the pad and the connecting lines in accordance with some embodiments.

The patterns such as composite pattern 100 as in FIG. 13 may be stored in computer. A plurality of operations may be performed to modify the patterns such as composite pattern 100 as in FIG. 13 to generate modified patterns 100', for example, as shown in FIG. 27, by adding patches 108A and 108B on composite pattern 100. The patches are added to the boundary regions 106 (FIGS. 13 and 27) where lines are joined to the corresponding pads. The boundary regions 106 include the interfaces where lines 104 join pads 102 and the vicinity regions. The determination of the boundary regions 106 is performed using a computer through a plurality of Boolean operations.

Figure 14:
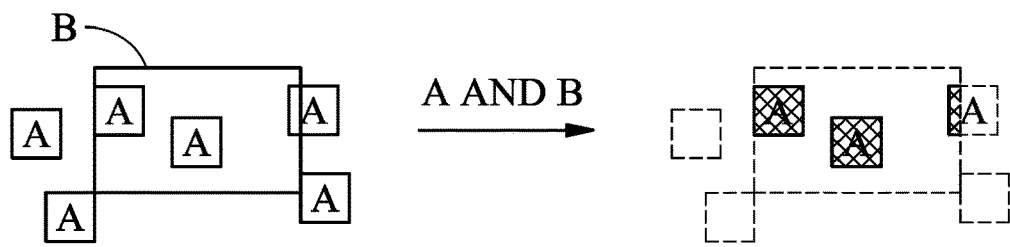
FIGS. 14 through 19 illustrate some Boolean operations that can be applied on patterns and the resulting patterns in accordance with some embodiments.
Figure 15:
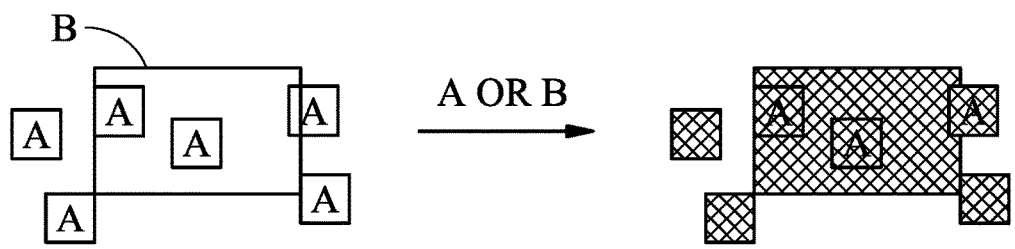
Figure 16:
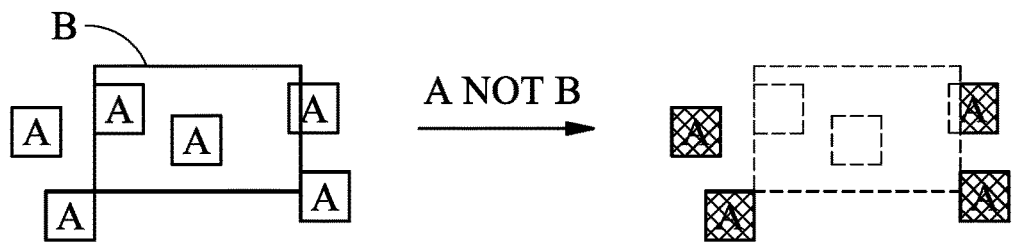
Figure 17:
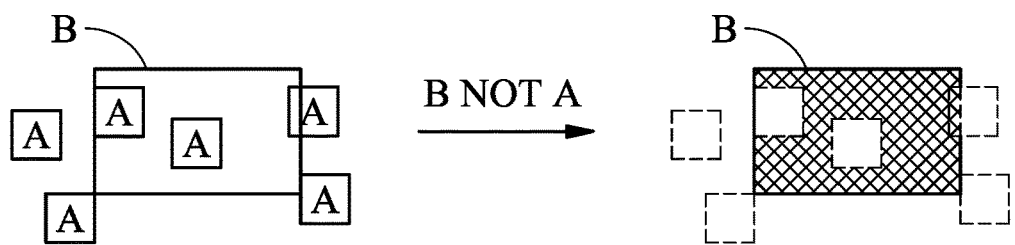
Figure 18:
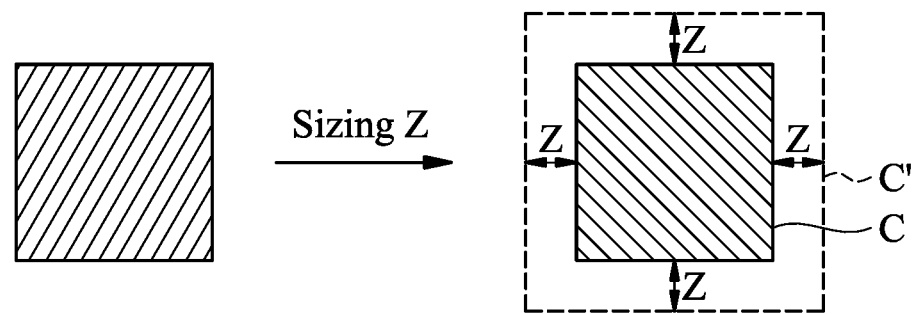
Figure 19:
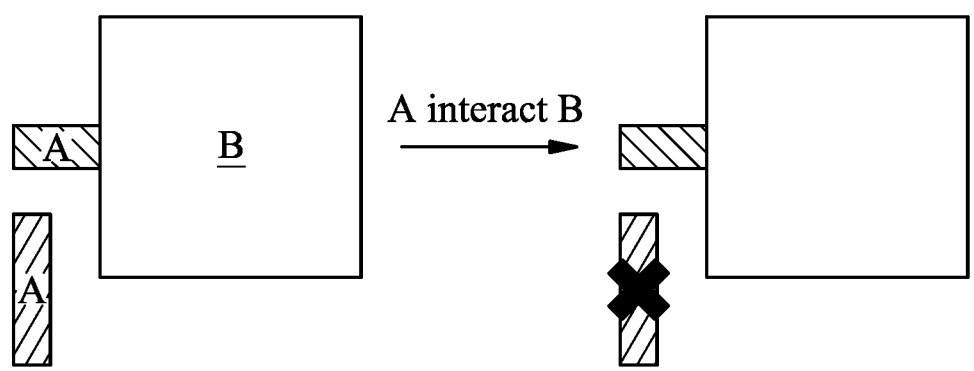

FIGS. 14 through 19 illustrate a plurality of standard Boolean operations that can be performed on patterns. These standard operations may be combined to determine the boundary regions 106. FIG. 14 illustrates an AND operation performed on patterns A and B. Through the AND operation, the patterns that belong to both patterns/regions A and B are left unremoved, and other regions are removed. FIG. 15 illustrates an OR operation performed on patterns A and B. Through the OR operation, the patterns/regions that belong to either one (or both) of patterns A and B are left, and other regions are removed. FIG. 16 illustrates a NOT operation performed on patterns A and B. The operation "A NOT B" removes the portions of patterns A that belong to patterns B. The patterns/regions that belong to patterns A, but do not belong to patterns B, are left unremoved. FIG. 17 illustrates a NOT operation performed on patterns A and B. The operation "B NOT A" removes the portions of patterns B that also belong to patterns A. The patterns/regions that belong to patterns B, but do not belong to patterns A, are left unremoved. FIG. 18 illustrates a Sizing operation performed on pattern C to result in an enlarged pattern C'. Through the "Sizing Z" operation, the outer boundaries of pattern C are pushed outwardly by distance Z in the directions perpendicular to the lengthwise directions of the respective portions of boundaries. FIG. 19 illustrates an Interact operation performed on patterns A and B. Through the "A Interact B" operation, the patterns/regions of A that are joined to pattern(s) B are left, and the patterns/regions of A that are not joined to pattern(s) B are removed. For example, as shown in FIG. 19, the pattern A that has the "X" sign is removed from the resulting pattern.

Figure 20:
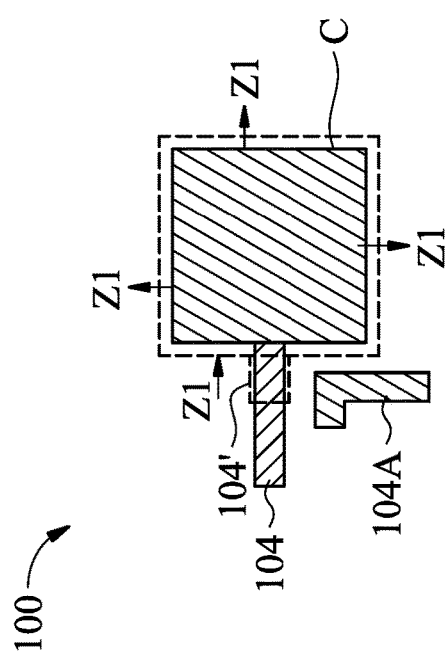
FIG. 20 illustrates an initial pattern including a pad and lines in accordance with some embodiments.
Figure 39:
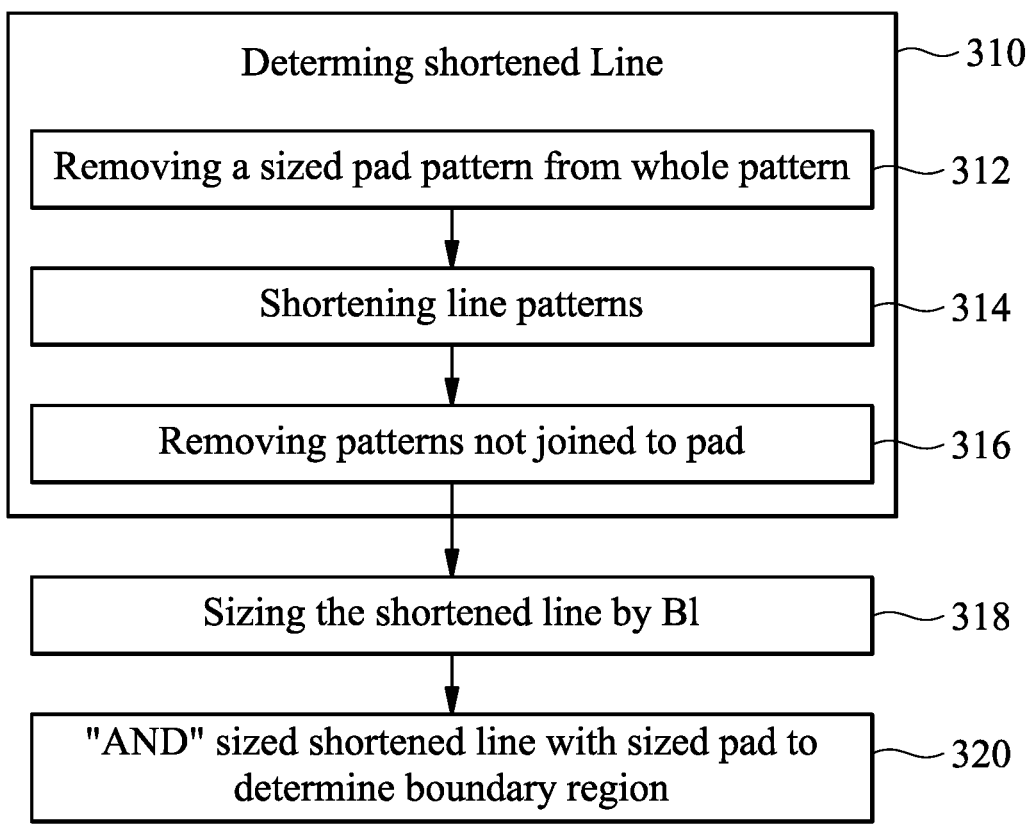
FIG. 39 illustrates a process flow for determining boundary regions of a pattern in accordance with some embodiments.

FIGS. 20 through 25 illustrate an example to show how the Boolean operations as shown in FIGS. 14 through 19 are combined to determine boundary region 106 as shown in FIG. 20. The initial pattern 100 as shown in FIG. 20 is simplified compared to the pattern 100 as shown in FIG. 13 for the simplicity of description. FIG. 20 illustrates initial pattern 100, which includes pad portion 102, line portion 104 joining to pad portion 102, and line portion 104A not joined to pad portion 102. It is appreciated that the same operations performed on the pattern 100 as shown in FIG. 20 may also be performed on pattern 100 as shown in FIG. 13 to determine boundary regions. The processes for determining boundary regions are also reflected schematically in the process flow 300 as shown in FIG. 39.

Figure 21:
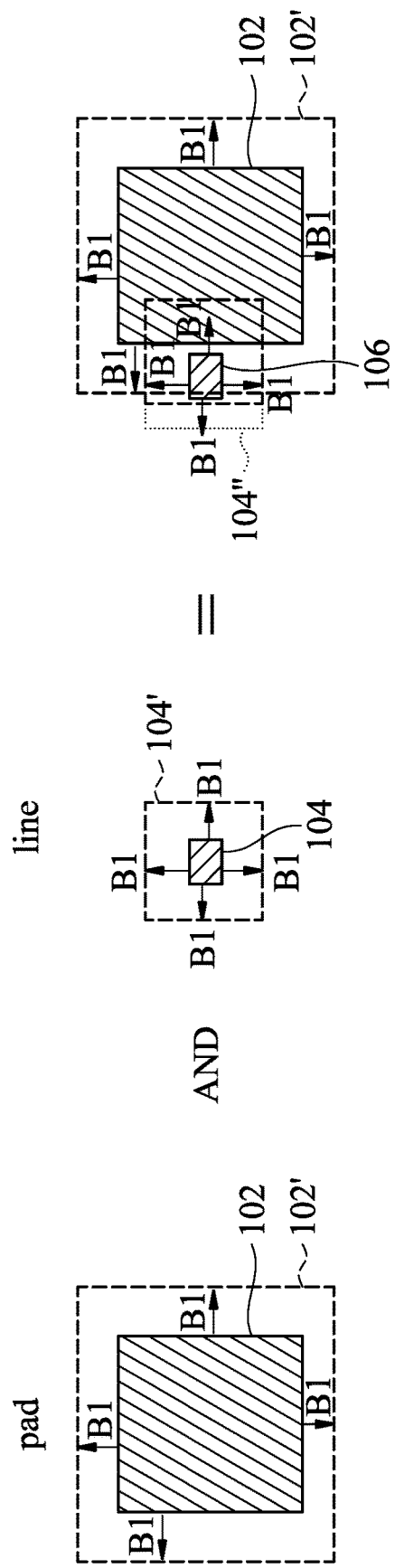
FIG. 21 illustrates an AND operation performed on a sized pad and a sized line portion in order to generate a boundary region in accordance with some embodiments.

FIG. 21 illustrates a framework of the Boolean operations for determining the boundary region 106 of line 104 and pad 102. Overall, the determination of boundary region 106 includes determining a portion 104' of line 104, which portion 104' is shortened from line 104. The portion 104' is also shown in FIG. 20. The respective process is illustrated as process 310 as shown in FIG. 39. In accordance with some embodiments of the present disclosure, as shown in FIG. 20, the line portion 104' has distance Z1 from pad 102, wherein the distance Z1 is used to solve truncate problem when pad 102 is not rectangular, as will be discussed in subsequent paragraphs. Otherwise, when pad 102 is rectangular, portion 104' may have a side touching a side of pad 102.

Referring to FIG. 21 again, the determination of the boundary region 106 includes sizing pad 102 by B1 to generate pattern 102', determine line portion 104', sizing line portion 104' to generate pattern 104", and then performing an (102' AND 104") operation to result in boundary region 106. The sizing size B1 may be in the range between about 2.25 μm and about 7.5 μm in accordance with some embodiments. The Boolean operations for determining line portion 104', and then sizing 104' to generate 104" are illustrated in FIGS. 22 through 25. On top of each of FIGS. 22 through 25, the Boolean operations related to the respective Figures are presented. The corresponding operation in FIGS. 22 through 25 is also highlighted using a dashed frame that marks a portion of the full operation to specify which new operation is performed on the patterns obtained in previous operations.

The full expression of the Boolean operations for determining boundaries 106 of an initial pattern (such as in FIG. 20) is shown in Equation 1 as follows:

Boundary(106)={{AP_PAD SIZING $B1$ μm} AND
{{{WHOLE_PATTERN NOT {PAD SIZING
$Z1$ μm}} AND {PAD SIZING $B1$ μm}}
INTERACT {PAD SIZING $Z1$ μm}} SIZING
$B1$ μm}    [Eq. 1]

wherein "PAD" corresponds to pad 102, and "WHOLE_PATTERN" corresponds to initial pattern 100.

Figure 22:
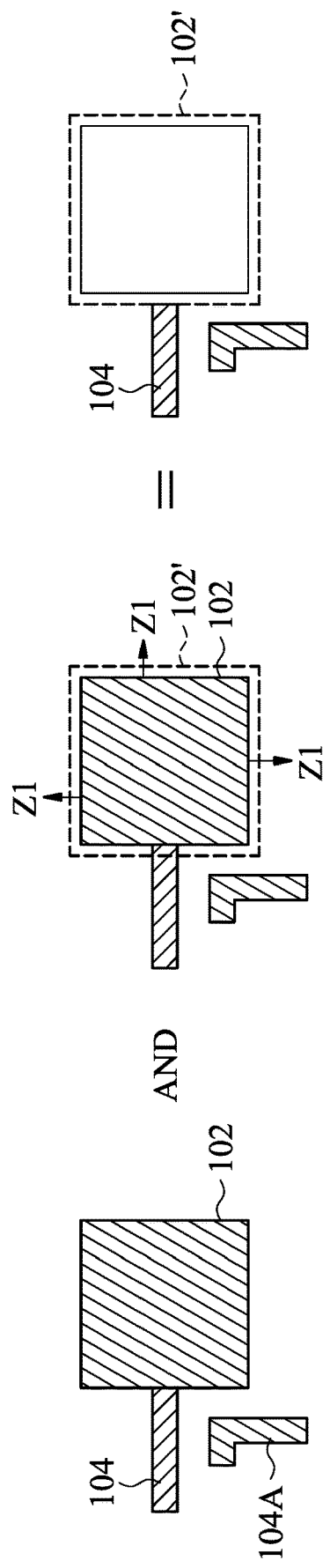
FIGS. 22 through 24 illustrate the intermediate steps in the determination of a portion of a line in accordance with some embodiments.

FIG. 22 illustrates a first Boolean operation, which is used to generate a pattern including line portions 104 and 104A, and excluding sized pattern 102' of pad pattern 102. The respective process is illustrated as process 312 as shown in FIG. 39. The line portions 104 and 104A are obtained by performing a NOT operation on the WHOLE_PATTERN to exclude the sized pattern 102' from the whole pattern in FIG. 20. The Boolean operations in FIG. 22 are {WHOLE_PATTERN NOT {PAD SIZING Z1 μm}}. The operation (PAD Sizing Z1) is to solve truncate problems, as discussed later. The value of Z1 is related to the grid width in patterning operation, and may be in the range between about 2 times and about 100 times the grid width. For example, a grid width may be 0.0005 μm, and hence the value of Z1 may be in the range between about 0.001 μm and about 0.05 μm in accordance with some embodiments.

Figure 23:
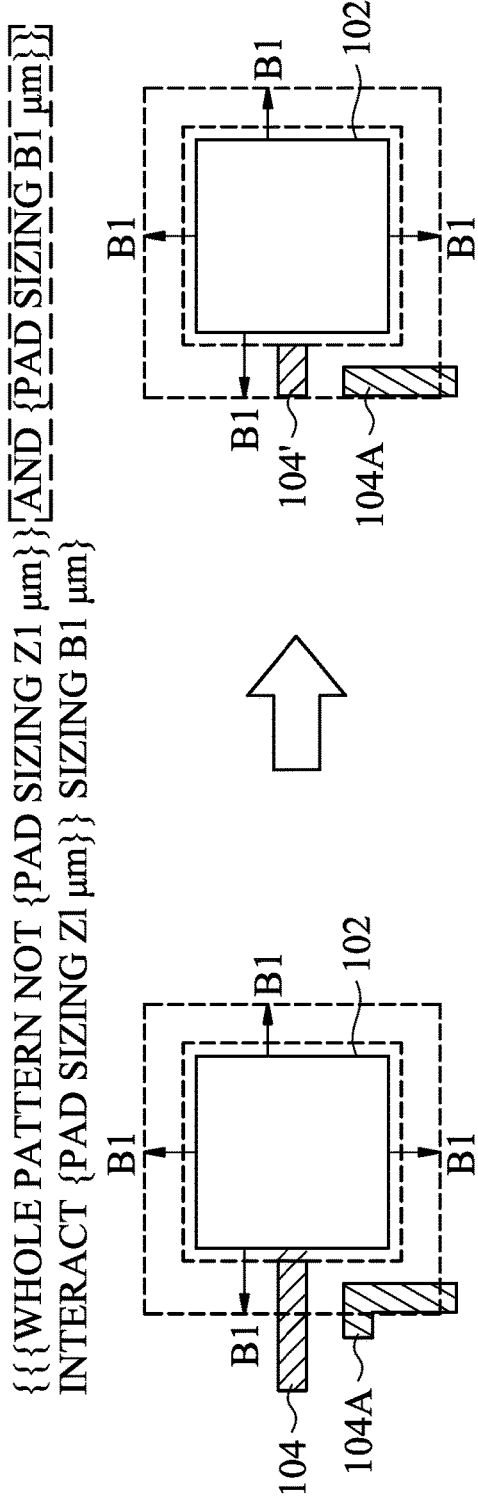

FIG. 23 illustrates the shortening of lines 104 and 104A. The respective process is illustrated as process 314 as shown in FIG. 39. Since line 104 may be longer than desirable, the portion of 104 far away from pad 102 is cut. This may be performed by further performing an AND operation to "AND" the pattern obtained in FIG. 22 with the pad 102 sized by B1. The Boolean operations in FIG. 23 are simplified as ("Pattern in FIG. 22" AND {PAD SIZING B1 μm}), and the full Boolean operations in FIGS. 22 and 23 are {{WHOLE_PATTERN NOT {PAD SIZING Z1 μm}} AND {PAD SIZING B1 μm}}.

Figure 24:
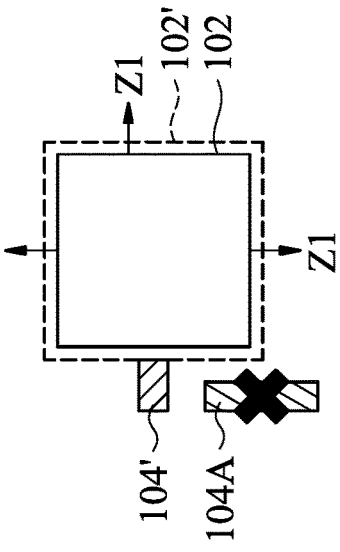

FIG. 24 shows how lines (such as 104A) that do not join pad 102 are removed. The respective process is illustrated as process 316 as shown in FIG. 39. The respective operation is achieved by performing an "Interact" operation to Interact the patterns obtained in FIG. 23 with the sized pattern 102' of pad 102. The Boolean operations in FIG. 24 is simplified as {"Pattern in FIG. 23" INTERACT {PAD SIZING Z1 μm}}, and the full Boolean operations in FIGS. 22 through 24 are {{{WHOLE_PATTERN NOT {PAD SIZING Z1 μm}} AND {PAD SIZING B1 μm}} INTERACT {PAD SIZING Z1 μm}}. After the operations in FIG. 24, the shortened line portion 104' is obtained (refer to FIG. 21).

Figure 25:
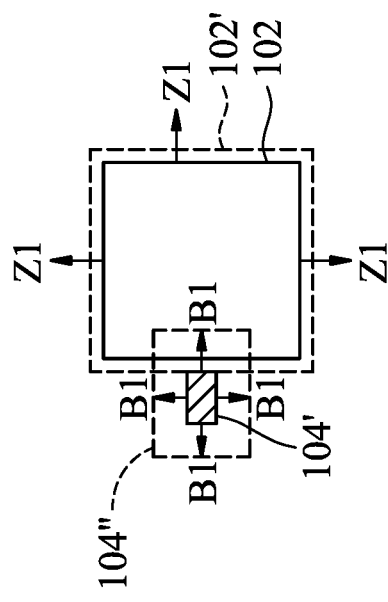
FIG. 25 illustrates the sizing of the pad and the AND operation for generating a boundary region in accordance with some embodiments.

FIG. 25 shows how the shortened line portion 104' is sized by B1 to result in sized shortened pattern 104". The respective process is illustrated as process 318 as shown in FIG. 39. This operation defines the vicinity region of the joint of line 104 and pad 102. The Boolean operations in FIG. 25 are simplified as ("Patterns in FIG. 24" SIZING B1 μm), and may be expressed as expression:

{{{WHOLE_PATTERN NOT {PAD SIZING Z1
μm}} AND {PAD SIZING $B1$ μm}} INTER-
ACT {PAD SIZING Z1 μm}} SIZING $B1$ μm}    [Ex. 1]

After the sized shortened patterns 104" is obtained, referring FIG. 25, the sized patterns 104" may be "AND" with the sized pattern 102' to obtain boundary region 106, which is shown in FIG. 21. The respective process is illustrated as process 320 as shown in FIG. 39. The respective Boolean operation may be simplified as {{AP_PAD SIZING B1 μm} AND (Ex. 1)}. The full expression of the Boolean operations in FIGS. 22 through 25 is shown as Equation 1 as provided above.

Figure 26:
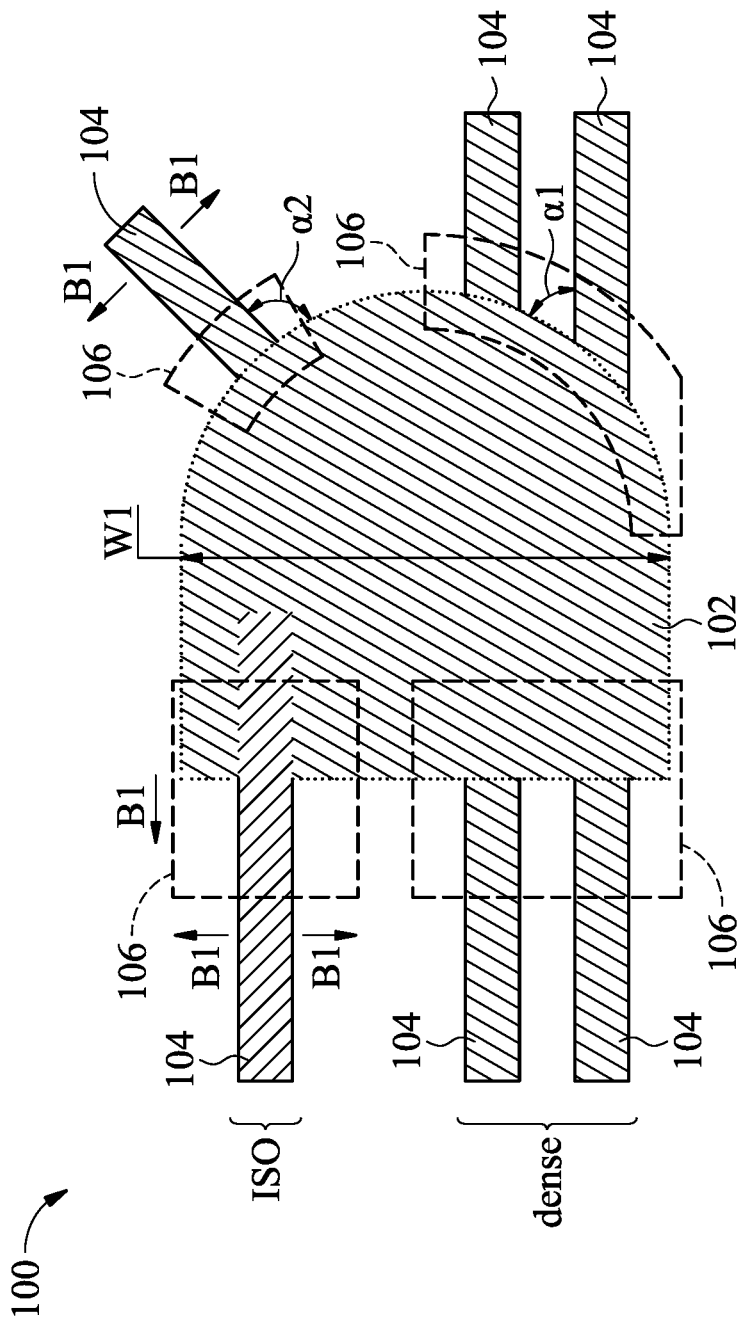
FIG. 26 illustrates boundary regions of a pattern shown in FIG. 20 in accordance with some embodiments.

The above-discussed operations are performed on a simplified pattern as shown in FIG. 20. When the same Boolean operations (as in Equation 1) are performed on the pattern shown in FIG. 13, boundary regions 106 are also generated, as shown in FIG. 26. At the joint of each line 104 with pad 102, there is one boundary region 106 found.

FIG. 26 illustrates the initial pattern with boundary regions 106 added. As shown in FIG. 26, lines 104 and pad 102 may form acute angles such as angle α1 or right angles such as angle α2. If the pattern 100 as shown in FIG. 26 is manufactured on semiconductor wafers and dies, for example, as metal pads and metal lines, the acute angles and the right angles cause the stress in the wafers and dies to be concentrated in boundary regions 106, causing the cracks in the lines, pads, and the adjacent dielectric layers. Accordingly, patches are formed in pattern 100 where acute angles and right angles exist, so that the acute angles and right angles are eliminated from the boundary regions, and obtuse angles are formed, as shown in FIG. 27. Since the patches, when formed on semiconductor wafers and dies, are formed simultaneous as the corresponding pad and lines as a continuous region, the acute angles and right angles are eliminated from the respective composite metal features (FIG. 12), and the stress concentration and the resulting cracking of lines, pads and dielectric layers is eliminated.

FIG. 27 illustrates modified pattern 100' (modified from initial pattern 100), in which patches 108 (including 108A and 108B) are added. In accordance with some embodiments, the angles in the boundary regions, which angles are formed between pad 102 and line 104 are analyzed, and the angles are compared to a pre-determined reference angle. The reference angle may be an angle equal to or greater than 90 degrees, and may be equal to or smaller than 135 degrees. For example, the reference angle may be 90 degrees, 100 degrees, 110 degrees, 120 degrees, 130 degrees, 135 degrees, or any angle in the range between (and including) 90 degrees and 135 degrees. If any angle in boundary region is equal to or smaller than the reference angle, a patch 108A is added to the corresponding region. For example, as shown in FIG. 26, assuming the reference angle is 90 degrees, since angle α1 (FIG. 26) is smaller than 90 degrees, and angle α2 is equal to 90 degrees, patches 108A are added, as shown FIG. 27. As a result, in the boundary regions, obtuse angle such as β1, β2, β3, and β4 are formed. Patches 108A may have triangular shapes, with each of patches 108A having one side contacting and fitting an edge of one of lines 104, and another edge contacting and fitting an edge of pad 102. In accordance with some embodiments of the present disclosure, the length BZ1 of the edges of patches 108A may be in the range between about 1/5B1 and about 2/3B1 (FIG. 21), with B1 being the sizing size. Value B1 is also roughly marked in FIG. 26. BZ1 is also smaller than the minimum spacing between neighboring lines 104.

Figure 32:
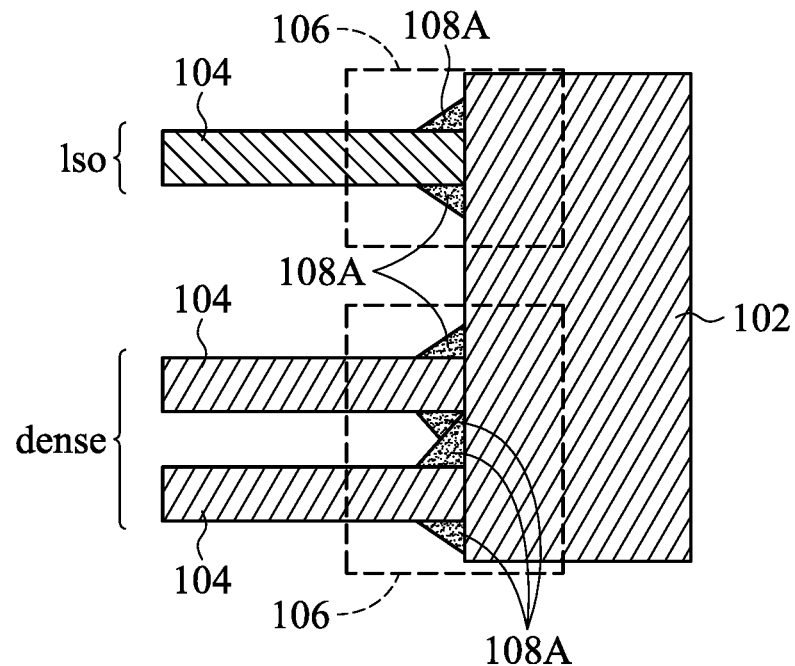
FIG. 32 illustrates the patterns of features after a first round of patching operations is performed in accordance with some embodiments.
Figure 33:
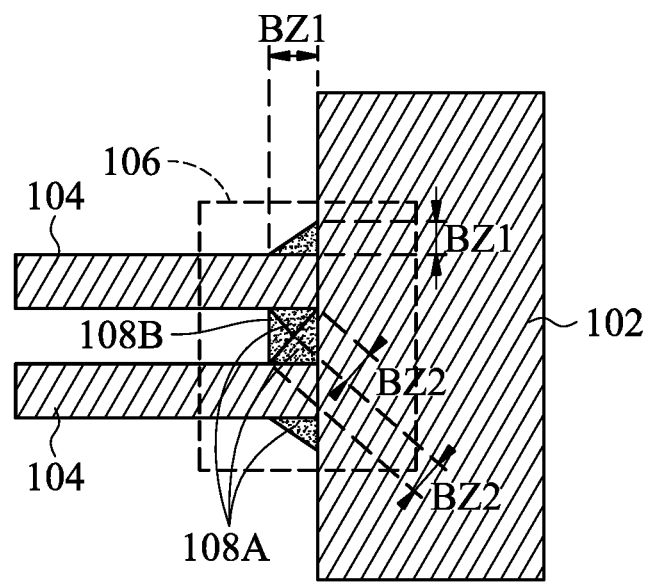
FIG. 33 illustrates the patterns of features after a second round of patching operations is performed in accordance with some embodiments.

It is appreciated that after one round of angle determination and patch-adding process (also referred to as a patching process) is made, some newly formed angles (such as angle γ1) may be smaller than or equal to the reference angle. To solve this problem, a second round of angle determination and patching process may be performed. As a result, patches 108B may be added, which may have one or two sides contacting patch(es) 108A, and may or may not have an edge contacting pad 102. FIGS. 32 and 33 illustrate the sequence of the first round of patching process and a second round of patching process, respectively. The size BZ2 of patches 108B may be in the range between about 1/4BZ1 and 1/2BZ1, and may be in the range between about 0.3 μm and about 3.5 μm.

To avoid violating design rules governing line widths, and to avoid pattern tailing problems from occurring, there may not be additional round of angle determination and patching process after the second round is performed.

After the modified pattern 100' (FIG. 27) is formed, the modified pattern 100' is formed on lithography masks such as the mask 32 in FIG. 2 or the mask 46 in FIG. 7. The lithography masks are used to form metal pads, lines, and patches on wafers and dies. The pads and lines are shown in FIG. 12 in some example embodiments. In the resulting wafers and dies, the pads, lines, and patches are formed as being a continuous pattern, with no distinguishable interface therebetween. In the boundary regions of the metal features 31 or 50, no acute angles and right angles are formed.

Figure 28:
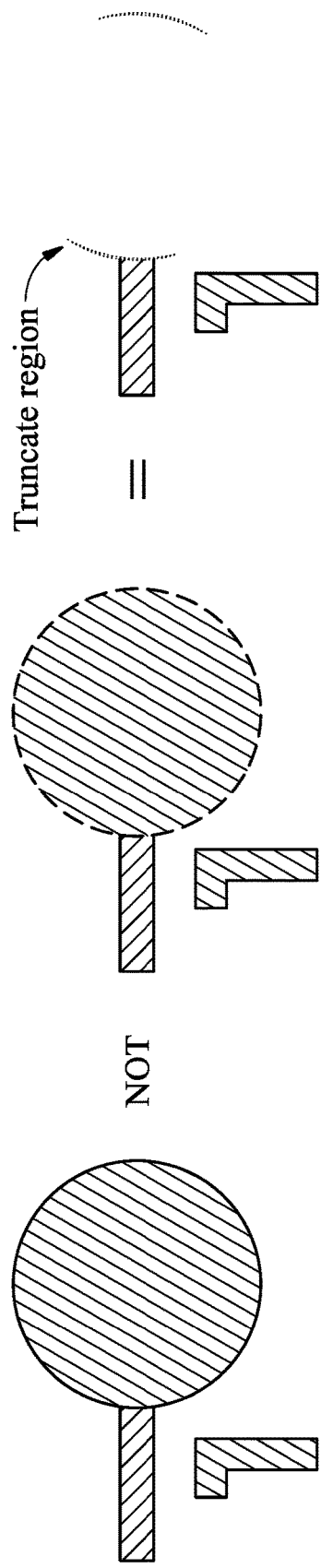
FIG. 28 illustrates an example truncate problem in accordance with some embodiments.
Figure 29:
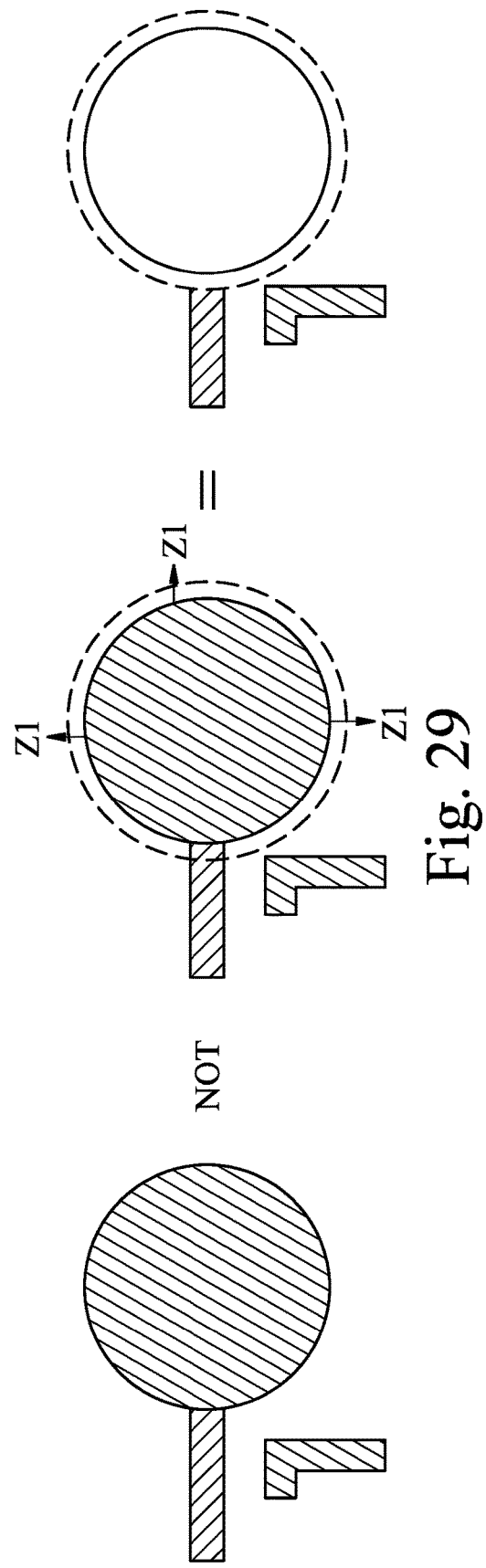
FIG. 29 illustrates solving the truncate problem through a sizing operation in accordance with some embodiments.

FIG. 28 illustrates an NOT operation performed on a non-rectangular pattern such as a circle, and demonstrates how truncate problems occur. This operation is the same operation shown in FIG. 22, and the corresponding Boolean operation is {WHOLE_PATTERN NOT PAD}. Since the boundary of the non-rectangular pattern such as circles does not fall exactly on grids, after the NOT operation of the pad, there may be some leftover portions due to pattern truncate, as shown in FIG. 28. This problem may be solved by sizing the pad pattern by Z1 (through operation {PAD SIZING Z1 μm}) to ensure that there is no pattern truncate problem occurring for the pad. The respective Boolean operation is {WHOLE_PATTERN NOT {PAD SIZING Z1 μm}}, and the corresponding pattern change and Boolean operation is shown in FIG. 29.

The Boolean operations as shown in FIGS. 20 through 25 include the sizing of pad by Z1. When it is known that all patterns are formed of rectangular patterns or the combinations of rectangular portions, and the lines have lengthwise directions orthogonal to the corresponding edges of the pad, since no truncate problem will occur, the Boolean operations may be simplified by not performing (Sizing Z1) operation. The respective boundary regions may be determined through simplified Equation 2:

Boundary(106)={{AP_PAD SIZING $B1$ μm} AND {{{WHOLE_PATTERN NOT PAD} AND {PAD SIZING $B1$ μm}} INTERACT PAD} SIZING $B1$ μm}    [Eq. 2]

Figure 30:
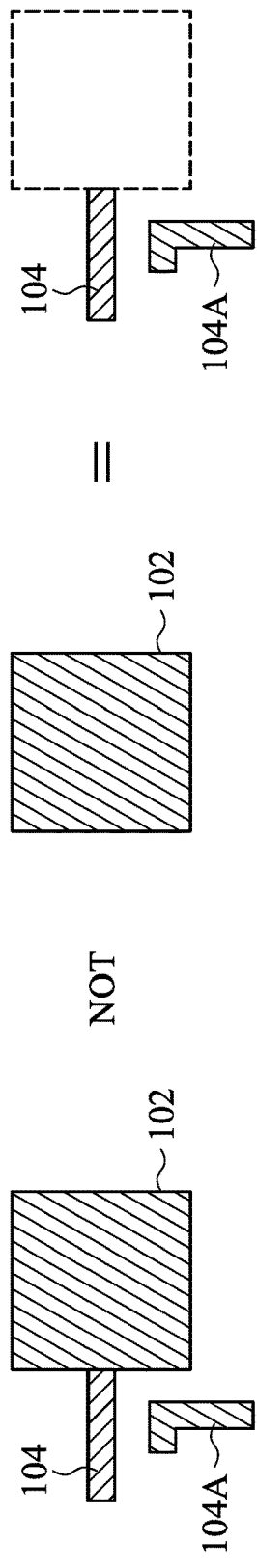
FIGS. 30 and 31 illustrate simplified Boolean operations for determining boundary regions of rectangular patterns in accordance with some embodiments.
Figure 31:
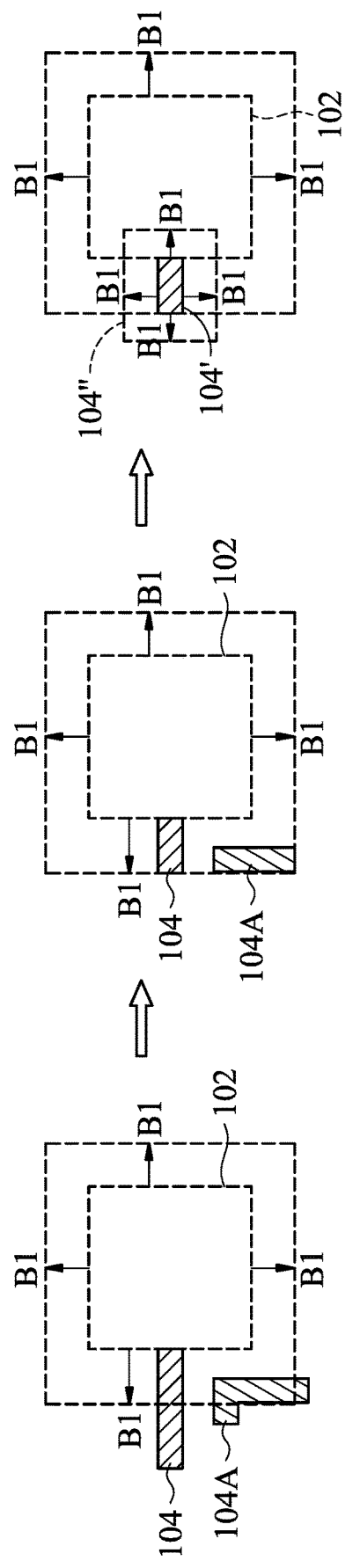

The corresponding Boolean operations for determining pattern 104" are shown in FIGS. 30 and 31. FIG. 30 illustrate the similar operation as shown in FIG. 22, except no (Sizing Z1) is performed. FIG. 31 illustrates the operations similar to what are shown in FIGS. 23 through 25, except that the (Sizing Z1) operation is omitted. The pattern 104" in FIG. 31 may then be used in FIG. 21 to generate the boundary region 106.

Figure 34:
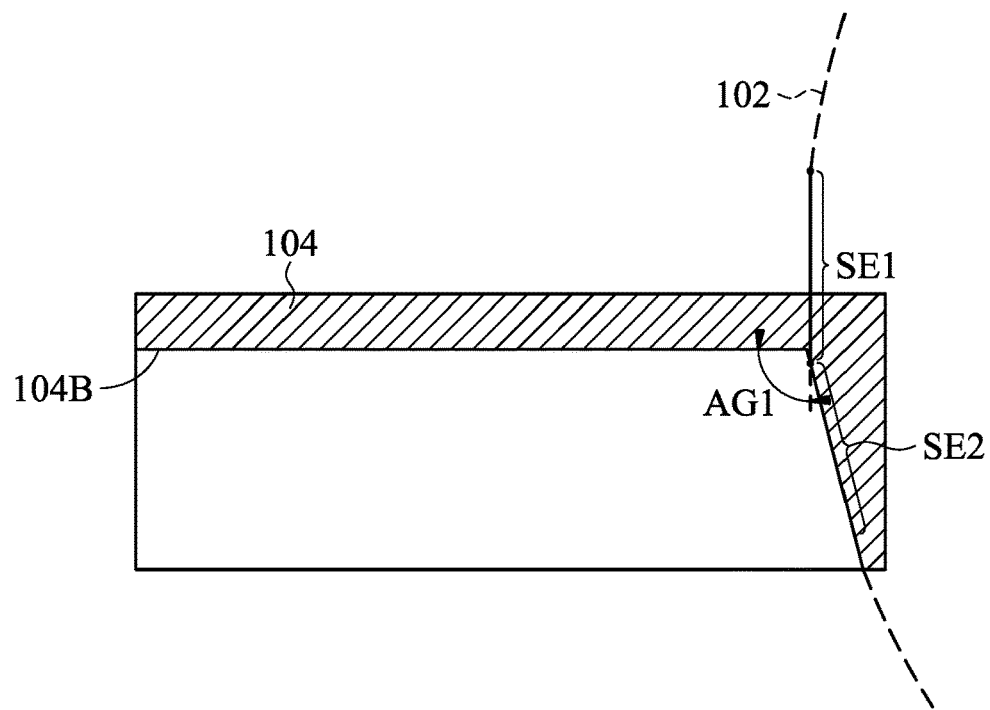
FIGS. 34 and 35 illustrate the patching on a curved edge of a pad in accordance with some embodiments.
Figure 35:
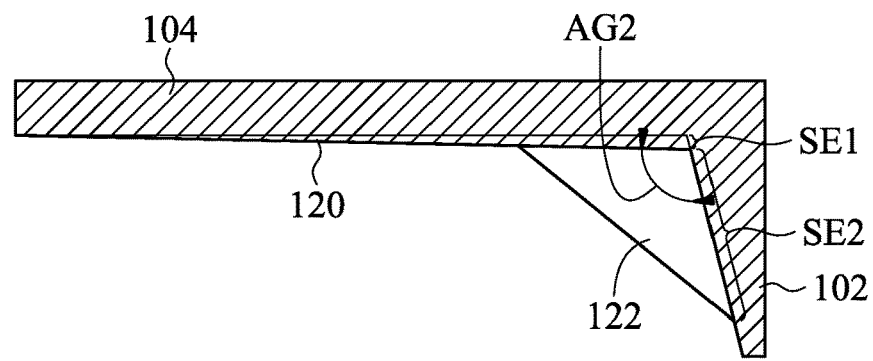

As shown in FIGS. 32 and 33 and FIG. 27, there may be two rounds of angle determination and patching processes. In each of the rounds, there is a reference angle used for determining whether a patch should be added. It is desirable that the references angles in the two rounds are equal to each other. Otherwise, problems may occur. For example, FIG. 34 illustrates a portion of a line 104 joining a pad 102. The pad 102 is circular-shaped, with the left part of pad 102 illustrated. In the database and computer for processing the patterns, the circular-shaped pattern is represented by a polygon having multiple (for example, at least 64) straight edges. Line 104 joins a first part of straight edge SE1 of pad 102, leaving a second part of straight edge SE1 forming angle AG1 with edge 104B of line 104. Angle AG1 is assumed to be 95 degrees. The first reference angle in the first round and the second reference angle in the second round of the patching process are assumed to be the same, for example, 110 degrees. Since 95 degrees are smaller than 110 degrees, a patch may be added in the first round, which patch is shown as triangle 120 in FIG. 35. In the second round, angle AG2, which is newly generated due to the patching of patch 120, is compared to the reference angle of the second round (110 degrees). Assuming angle AG2 is 100 degrees, which is also smaller than 110 degrees, patch 122 is added.

Now assuming the first reference angle is not equal to the second reference angle, problem may occur. For example, assuming the first reference angle is 90 degrees and the second reference angle is 110 degrees. Since angle AG1 is 95 degrees, which is greater than 90 degrees, the first patch 120 is not added. Since angle AG2 is 100 degrees, which is smaller than 110 degrees, the second patch 122 is not added. This causes the adding of patch 122 but not patch 120, and the result pattern is irregular, and causes problems. Accordingly, in accordance with some embodiments of the present disclosure, the first reference angle and the second reference angle are set to be the same as each other.

Figure 36:
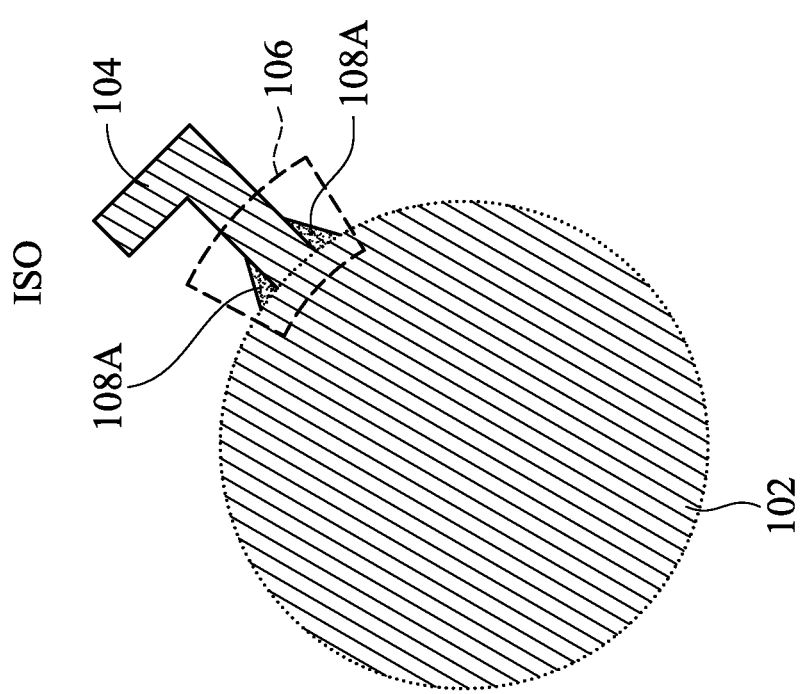
FIG. 36 illustrates the patching on a round pad in accordance with some embodiments.
Figure 38:
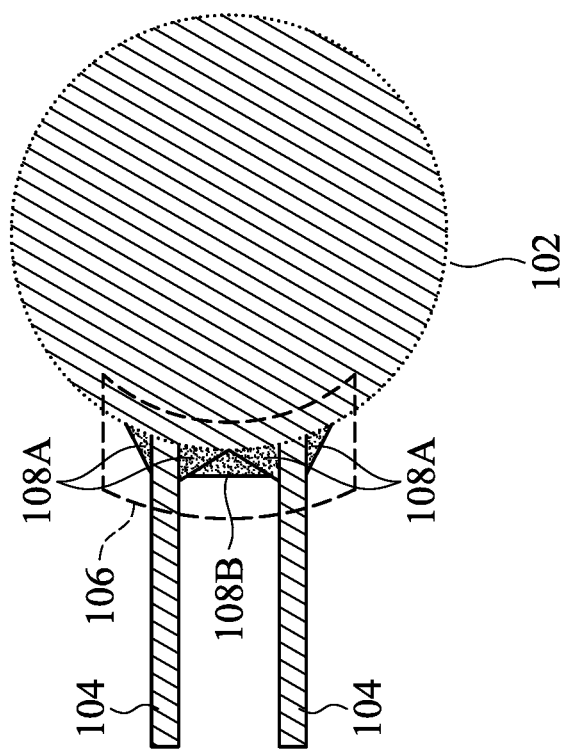
FIG. 38 illustrates two rounds of patching processes in accordance with some embodiments.
Figure 37:
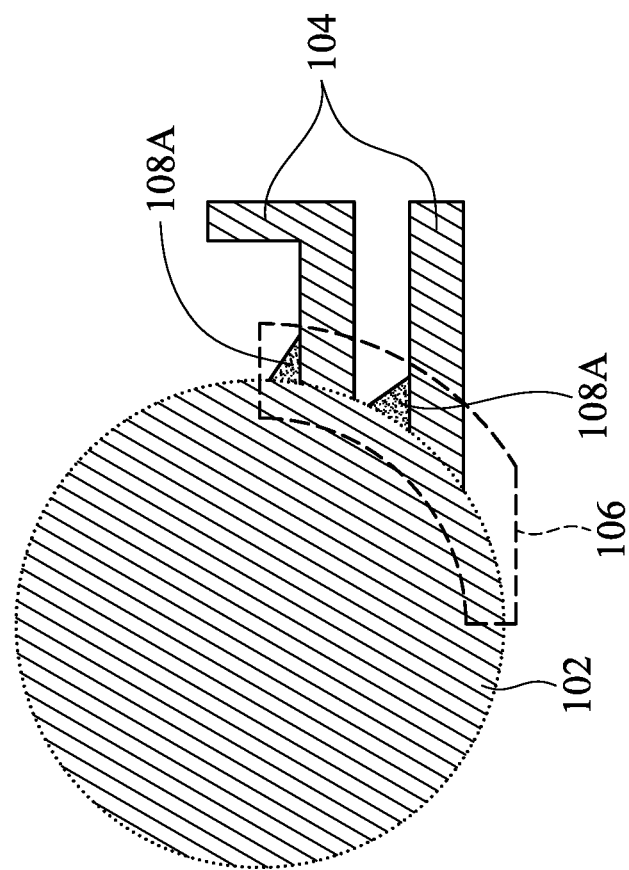
FIG. 37 illustrates the patching on one side of a line in accordance with some embodiments.

The patches may be added with some variations. For example, FIG. 36 illustrates the patches 108A added in an iso pattern, wherein patches 108A are added to opposite sides of line 104. FIG. 37 illustrates the patches 108A added in a dense region, wherein patches 108A are added to one side of each of lines 104. FIG. 38 illustrates an embodiment wherein patches 108A and 108B are added to a dense region.

The embodiments of the present disclosure have some advantageous features. By performing Boolean operations to determine boundary regions, and then modifying patterns, the acute angles and right angles of the initial pattern are eliminated, and obtuse angles are formed in the modified pattern. The modified patterns are formed on lithography masks, and are formed on semiconductor wafers and dies. The stress concentration problem to the joint patterns of lines and pads is thus solved, the cracking of pads and lines and the adjacent dielectric layers is thus avoided.

In accordance with some embodiments of the present disclosure, a method includes forming a seed layer on a semiconductor wafer; coating a photo resist on the seed layer; performing a photo lithography process to expose the photo resist; developing the photo resist to form an opening in the photo resist, wherein the seed layer is exposed, and wherein the opening comprises a first opening of a metal pad and a second opening of a metal line connected to the first opening, wherein at a joining point of the first opening and the second opening, a third opening of a metal patch is formed, so that all angles of the opening and adjacent to the first opening are greater than 90 degrees; plating the metal pad, the metal line, and the metal patch in the opening in the photo resist; removing the photo resist; and etching the seed layer to leave the metal pad, the metal line and the metal patch. In an embodiment, the photo resist is light-exposed using a lithography mask, and the lithography mask comprises a pattern of the metal pad, a pattern of the metal line, and a pattern of the metal patch. In an embodiment, the method further includes performing Boolean operations on an initial pattern, wherein the initial pattern comprises a pattern of the metal pad and a pattern of the metal line. In an embodiment, the method further includes adding a pattern of the metal patch, with the pattern of the metal patch having an edge abutting an edge of the pattern of the metal pad, and an edge abutting an edge of the metal line. In an embodiment, the Boolean operations comprise determining boundary regions of the initial pattern. In an embodiment, the determining the boundary regions of the initial pattern comprises removing the pattern of the metal pad from the initial pattern; shortening the pattern of the metal line to form a shortened metal line pattern; removing patterns not joined to the pattern of the metal pad; sizing the shortened metal line pattern to form a sized shortened metal line pattern; and performing an AND operation on the sized shortened metal line pattern and a sized pattern of the metal pad. In an embodiment, the metal patch has an edge forming a first obtuse angle with the metal line, and a second obtuse angle with the metal pad.

In accordance with some embodiments of the present disclosure, a method includes coating a photo resist; patterning the photo resist to form an opening in the photo resist, wherein the opening comprises a pad portion, wherein the pad portion comprises a first edge; a line portion joining to the pad portion, wherein the line portion comprises a second edge, and the first edge and the second edge form a right angle; and a triangular patch portion comprising a third edge contacting the first edge, and a fourth edge contacting the second edge, and a fifth edge forming obtuse angles with the first edge and the second edge; and depositing materials into the opening to form a continuous feature, wherein the continuous feature comprises a metal pad, a metal line connected to the metal pad, and a metal patch corresponding to the pad portion, the line portion, and the triangular patch portion of the opening, respectively. In an embodiment, the opening comprises a plurality of line portions connected to the pad portion, wherein at each corners where the plurality of line portions form a right angle or an acute angle with the pad portion, a patch portion exists to convert the right angle or the acute angle to at least two obtuse angles. In an embodiment, the obtuse angles are greater than about 110 degrees. In an embodiment, the obtuse angles are smaller than about 135 degrees. In an embodiment, the patterning the photo resist comprises performing a light-exposure on the photo resist using a lithography mask, and the lithography mask comprises a pattern of the opening.in an embodiment, the method includes forming the lithography mask, and the forming the lithography mask performing Boolean operations on an initial pattern, wherein the initial pattern comprises patterns of the pad portion and the line portion, and the Boolean operations determine boundary regions of the pad portion and the line portion; adding the triangular patch portion to the initial pattern to form a modified pattern; and forming the lithography mask having the modified pattern. In an embodiment, the boundary regions are determined through processes comprising removing a pattern of the metal pad from the initial pattern; shortening the pattern of the metal line to form a shortened line pattern; removing patterns not joined to the pattern of the pad portion; sizing the shortened line pattern to form a sized shortened line pattern; and performing an AND operation on the sized shortened line pattern and a sized pattern of the pad portion. In an embodiment, the opening further comprises a first additional line portion joining the pad portion; a second additional line portion joining the pad portion; and an additional patch portion comprising edges contacting the first additional line portion, the second additional line portion, and the pad portion, wherein edges of the additional patch portion form a first obtuse angle with the first additional line portion and a second obtuse angle with the second additional line portion, and the additional patch portion comprises two additional obtuse angles.

In accordance with some embodiments of the present disclosure, a method includes removing a pattern of a pad from an initial pattern, wherein the initial pattern comprises the pattern of the pad, and a pattern of a line joining the pattern of the pad; shortening the pattern of the line to form a shortened line pattern; removing patterns not joined to the pattern of the pad; sizing the shortened line pattern to form a sized shortened line pattern; performing an AND operation on the sized shortened line pattern and a sized pattern of the pad to generate a boundary region; and adding a pattern of a patch into the boundary region to form a modified pattern. In an embodiment, the adding the pattern of the patch results in right angles and acute angles in the initial pattern to be removed. In an embodiment, the method further includes forming a lithography mask having the modified pattern. In an embodiment, the method further includes exposing a photo resist using the lithography mask; and forming a metal feature based on the photo resist. In an embodiment, the method further includes forming a metal feature on a semiconductor wafer, wherein the metal feature comprises a metal pad having the pattern of the pad, a metal line having the pattern of the line, and a metal patch having the pattern of the patch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a lithography mask, wherein the forming comprises:
        generating an initial pattern, wherein the initial pattern comprises a pattern of a pad, and a pattern of a line joining the pattern of the pad;
        determining positions of the pattern of the pad and the pattern of the line;
        determining a boundary region, wherein the pattern of the pad joins the pattern of the line in the boundary region;
        adding a pattern of a patch into the boundary region to form a modified pattern; and
        manufacturing the lithography mask comprising the modified pattern.

2. The method of claim 1, wherein the adding the pattern of the patch results in a right angle or an acute angle in the initial pattern to be converted to obtuse angles.

3. The method of claim 1, wherein the lithography mask comprises opaque portions for blocking light and transparent portions allowing light to penetrate through.

4. The method of claim 3 further comprising:
    exposing a photoresist using the lithography mask;
    developing the photoresist; and
    forming a metal feature based on the photoresist.

5. The method of claim 1 further comprising forming a feature on a semiconductor wafer using the lithography mask, wherein the feature has the modified pattern.

6. The method of claim 5, wherein the forming the feature comprises:
    using the lithography mask to form a plating mask comprising an opening, wherein the opening has the modified pattern; and
    plating a metallic material in the opening to form the feature.

7. The method of claim 5, wherein the forming the feature comprises:
    depositing a blank metal layer;
    using the lithography mask to form a patterned photoresist on the blank metal layer; and
    using the patterned photoresist to etch the blank metal layer, wherein a remaining portion of the blank metal layer comprises the feature.

8. The method of claim 1, wherein the determining the boundary region comprises a plurality of Boolean operations, in which the pattern of the pad and the pattern of the line are processed.

9. The method of claim 8, wherein the Boolean operations comprise:
    removing the pattern of the pad from the initial pattern;
    shortening the pattern of the line to form a shortened line pattern;
    removing patterns not joined to the pattern of the pad;
    sizing the shortened line pattern to form a sized shortened line pattern; and
    performing an AND operation on the sized shortened line pattern and a sized pattern of the pad to generate the boundary region.

10. A method comprising:
    forming a lithography mask, wherein the forming comprises:
        performing a plurality of Boolean operations on an initial pattern, wherein the initial pattern comprises a pad pattern and a line pattern joined together to form a part of a combined pattern, and wherein the plurality of Boolean operations are performed to determine boundary regions of patterns in the initial pattern; and
        adding a pattern of a patch into one of the boundary regions to form a modified pattern that comprises the pad pattern, the line pattern, and the pattern of the patch; and
        implementing the modified pattern therein on the lithography mask.

11. The method of claim 10, wherein the pattern of the patch is joined to both of the line pattern and the pad pattern in the initial pattern.

12. The method of claim 10, wherein the adding the pattern of the patch results in an acute angle or a right angle formed between the pad pattern and the line pattern to be converted to two obtuse angles.

13. The method of claim 10 further comprising forming a physical chip, with the modified pattern being transferred as a feature in the physical chip.

14. The method of claim 13, wherein the feature in the physical chip is a metal feature.

15. The method of claim 10, wherein the plurality of Boolean operations comprise a sizing operation for sizing up the pad pattern to generate an enlarged region.

16. The method of claim 15, wherein the plurality of Boolean operations further comprise removing all patterns in the enlarged region, wherein the removed all patterns comprise the pad pattern.

17. A method comprising:
providing an initial pattern, wherein the initial pattern comprises:
  a first pattern of a pad; and
  a second pattern of a line joining the first pattern of the pad;
determining a boundary region, wherein the first pattern joins the second pattern in the boundary region;
inserting a pattern of a patch into the boundary region to form a modified pattern; and
implementing the modified pattern on a lithography mask, wherein the lithography mask comprises transparent portions and opaque portions, and wherein one of the transparent portions and the opaque portions comprises the modified pattern.

18. The method of claim 17, wherein the inserting the pattern of the patch results in an acute angle or a right angle formed between the first pattern and the second pattern in the initial pattern to be converted into two obtuse angles in the modified pattern.

19. The method of claim 17, wherein the determining the boundary region comprises performing a plurality of Boolean operations on the initial pattern.

20. The method of claim 19, wherein the plurality of Boolean operations are selected from the group consisting of an AND operation, an OR operation, a NOT operation, a sizing operation, an interact operation, and combinations thereof.

* * * * *